(12) United States Patent
Kamon

(10) Patent No.: US 6,737,198 B2
(45) Date of Patent: May 18, 2004

(54) PHOTOMASK, FABRICATION METHOD OF PHOTOMASK, AND FABRICATION METHOD OF SEMICONDUCTOR INTEGRATED CIRCUIT

(75) Inventor: Kazuya Kamon, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/320,946

(22) Filed: May 26, 1999

(65) Prior Publication Data

US 2001/0049062 A1 Dec. 6, 2001

(30) Foreign Application Priority Data

Jan. 13, 1999 (JP) ............................................. 11-006956

(51) Int. Cl.⁷ ............................... G03F 9/00; G03C 5/00
(52) U.S. Cl. ........................................... 430/5; 430/312
(58) Field of Search ......................... 430/5, 322, 323, 430/324, 312, 314, 313, 316

(56) References Cited

U.S. PATENT DOCUMENTS

| | | | | |
|---|---|---|---|---|
| 5,437,947 A | * | 8/1995 | Hur et al. | 430/5 |
| 5,480,747 A | * | 1/1996 | Vasudev | 430/5 |
| 5,824,439 A | * | 10/1998 | Lee | 430/5 |
| 5,945,237 A | * | 8/1999 | Tanabe | 430/5 |
| 5,972,540 A | * | 10/1999 | Lee | 430/5 |
| 6,017,659 A | * | 1/2000 | Lee et al. | 430/5 |
| 6,037,083 A | * | 3/2000 | Mitsui | 430/5 |

FOREIGN PATENT DOCUMENTS

| | | |
|---|---|---|
| JP | 57-62052 | 9/1980 |
| JP | 57-207250 | 12/1982 |
| JP | 58-173744 | 2/1983 |
| JP | 62-67514 | 9/1985 |
| JP | 62-67547 | 9/1985 |
| JP | 63-304257 | 5/1988 |
| JP | 64-88550 | 4/1989 |
| JP | 1-200258 | 8/1989 |
| JP | 3-263045 | 3/1990 |
| JP | 4-5655 | 1/1992 |
| JP | 6-301194 | 10/1994 |
| JP | 6-90999 | 11/1994 |
| JP | 7-248610 | 9/1995 |
| JP | 10-10699 | 1/1998 |
| JP | 10-90875 | 4/1998 |
| JP | 10-186628 | 7/1998 |

* cited by examiner

Primary Examiner—Mark H. Huff
Assistant Examiner—Saleha R. Mohbamedulla
(74) Attorney, Agent, or Firm—Burns, Doane, Swecker & Mathis, L.L.P.

(57) ABSTRACT

A photomask fabricated by a photomask fabrication method has a transparent substrate (10), a shade pattern (11) formed in a hollow section (23), and a phase shift pattern (102) having a flat surface that is selectively formed on the transparent substrate (10) and the shield pattern (11).

34 Claims, 33 Drawing Sheets

← DIRECTION OF ROTATION

PHOTOMASK, FABRICATION METHOD OF PHOTOMASK, AND FABRICATION METHOD OF SEMICONDUCTOR INTEGRATED CIRCUIT

BACKGROUND OF THE INVENTION

1. Field of the Invention

The present invention relates to a photomask to be used in a fabrication process of semiconductor integrated circuits such as liquid crystal displays, a fabrication method of the photomasks, and a fabrication method for semiconductor integrated circuits.

2. Description of the Related Art

A projection exposure apparatus exposures circuit patterns such as semiconductor circuit elements printed on a photomask to a wafer. In addition, it is required for the projection exposure apparatus to have functions of a higher resolution and a fine-pattern reprinted.

In general, when a numerical aperture NA is greater and the wavelength of exposing light is shorter, the resolution of the projection exposure apparatus can be increased. Because the depth of focus becomes small during a pattern printing process when the numerical aperture NA of the projection exposure apparatus is increased, it is limited to increase the numerical aperture NA. Further, when the wavelength of exposure light is changed to smaller wavelength, it must be required to greatly change the pattern printing process.

In the prior art, an improved method to improve an image formation of a photomask has been disclosed. In this improved method, a phase shifter to be used for reversing a phase is formed in a part of a photomask where an exposure light is passed, and a phase of the exposure light is controlled in addition to the control of an amplitude of the exposure light.

For example, there are conventional methods about the phase shifter described in following patent documents: JP-A-57/62052, JP-A-58/173744, JP-A-62/67514, JP-A-62/67547, JP-A-63/304257, and JP-A-3/263045.

FIG. 1A to FIG. 1F are diagrams showing a conventional fabrication method of a photomask. In FIG. 1A to FIG. 1F, the reference number 220 designates a transparent substrate such as a transparent glass substrate, 222 denotes a shade film, and 224 indicates a resist film. When the fabrication process for the photomask is completed, shade patterns 111 are formed on the transparent glass substrate 220 at desired intervals shown in FIG. 1F.

FIG. 2A to FIG. 2F are diagrams showing a conventional fabrication method of a photomask of a low reflection type. In FIG. 2A to FIG. 2F, the reference numbers 231 and 232 designates reflection preventing film formed under and on the shade film 222. When the fabrication process for the photomask is completed, the shade patterns 111 are formed at desired intervals on the transparent glass substrate 220 shown in FIG. 2F. In this configuration, the reflection preventing films 231 and 232 are formed under and on each shade pattern 111.

FIG. 3A to FIG. 3D are diagrams showing a conventional fabrication method of a phase shift photomask. In FIG. 3A to FIG. 3D, the reference numbers 226 designates phase shift sections, and 225 denotes a hollow section (or a cavity section).

In the final fabrication process to fabricate a conventional phase shift photomask, as shown in FIG. 3D, the shade patterns 111 are formed adjacent to the hollow section 225 formed on the transparent glass substrate 220. Further, the phase shift section 226 are formed adjacent to each shade pattern 111.

As described above, a complicated topography or shape is formed on the photomask fabricated by the conventional photomask fabrication methods such as the method to form the shade patterns on the photomask at desired intervals shown in FIG. 1A to FIG. 1F and FIG. 2A to FIG. 2F, and the method to form the phase shift pattern on the photomask at desired intervals shown in FIG. 3A to FIG. 3D.

Thus, because each conventional photomask fabricated by the conventional methods has a complicated topography, it happens that the shade film is fallen or separated from the transparent glass substrate by a brush to be used during a washing process to eliminate dusts. In other words, the conventional photomask has a lower durability during the photomask fabrication process. This drawback of the conventional photomask causes to decrease a reliability of the photomask and to decrease the yield and quality of semiconductor integrated circuits manufactured by using the conventional photomask.

SUMMARY OF THE INVENTION

Accordingly, an object of the present invention is, with due consideration to the drawbacks of the conventional technique, to provide photomasks, fabrication methods of the photomasks, and a semiconductor fabrication method of semiconductor integrated circuits such as liquid crystal displays. The photomasks of the present invention have a high mechanical durability during a fabrication process to fabricate the photomask, and has characteristics of a high image formation, a high quality, a high printing precision, and a higher yield in the fabrication process.

In accordance with a preferred embodiment of the present invention, a photomask comprises a transparent substrate, a hollow section formed on a surface of said transparent substrate, a shade pattern including a shade section, said shade section made up of a shade film and formed in said hollow section, and reflection preventing sections, each formed according to one of cases: each reflection preventing section formed on said shade section; each reflection preventing section formed under said shade section; and each reflection preventing section formed on and under said shade section.

In accordance with another preferred embodiment of the present invention, a photomask comprises a transparent substrate, a shade pattern formed on said surface of said transparent substrate, and a phase shift pattern selectively formed on said shade pattern and said transparent substrate. In the photomask, a surface of said phase shift pattern is flat.

In the photomask as another preferred embodiment, an end section of said phase shift pattern that is contacted to said transparent substrate has a sloped shape that is gradually thin.

In the photomask as another preferred embodiment, a difference of a step between said phase shift pattern and said transparent substrate at said end section of said phase shift pattern that is contacted to said transparent substrate is gradually small.

In accordance with a preferred embodiment of the present invention, a photomask comprises a transparent substrate, a hollow section formed on a surface of said transparent substrate, a shade pattern made up of a shade film, said shade film formed in said hollow section, and a phase shift pattern, whose surface is flat, selectively formed on said transparent substrate having said shade pattern formed in said hollow section.

In the photomask as another preferred embodiment, a thickness of an end section of said phase shift pattern contacted to said transparent substrate is gradually thin.

In accordance with a preferred embodiment of the present invention, a photomask comprises a transparent substrate, a hollow section formed on a surface of said transparent substrate, a shade pattern made up of a shade film, said shade film formed in said hollow section, and a phase shift pattern formed on said transparent substrate including said shade pattern formed in said hollow section.

In the photomask as another preferred embodiment, an end section of said phase shift pattern that is contacted to said transparent substrate has a sloped shape that is gradually thin.

In the photomask as another preferred embodiment, said phase shift pattern includes one of or a combination of: a phase shift pattern of a Levenson's type, a phase shift pattern of an auxiliary shifter type; a phase shift pattern of an edge highlighting type; a phase shift pattern of a half tone type; a phase shift pattern of a half tone type with a shade pattern, a phase shift pattern of a shifter shading type with a shade pattern; and a phase shift pattern of an intermediate phase type.

In accordance with a preferred embodiment of the present invention, a photomask fabrication method comprises the steps of forming a resist film on a transparent substrate, forming a desired pattern on said resist film by developing said resist film after said resist film is selectively exposing by using a radiation ray, forming hollow sections in said transparent substrate by selectively etching said transparent substrate by using said resist film as a mask, eliminating said resist film from said transparent substrate, forming a first reflection preventing film in each of said hollow sections, forming a shade film on said first reflection preventing film formed in each of said hollow sections, forming a shade pattern by performing a chemical and mechanical polishing for said shade film, and forming a second reflection preventing film on said shade pattern. In the photomask fabrication method, said processes for forming said first reflection preventing process and said second reflection preventing process are performed selectively.

In accordance with a preferred embodiment of the present invention, a photomask fabrication method comprises the steps of forming a shade pattern on a transparent substrate, coating a phase shift film on both said transparent substrate and said shade pattern, forming a phase shift pattern by selectively etching said phase shift film by using a radiation ray, and performing a chemical and mechanical polishing for a surface of said phase shift pattern in order to form said phase shift pattern having a desired thickness.

In the photomask fabrication method as another preferred embodiment, after the step of forming said phase shift pattern, further comprises the steps of selectively etching said phase shift pattern by using said radiation ray, and performing said chemical and mechanical polishing for said surface of said phase shift pattern that has been etched in order to form said phase shift pattern having a desired thickness and a flat surface.

In the photomask fabrication method as another preferred embodiment, after the step of forming said shade pattern on said transparent substrate, further comprises the steps of forming a resist film on said shade pattern, forming a resist pattern by selectively etching said resist film by using said radiation ray, selectively etching said transparent substrate by using said resist pattern as a mask, eliminating said resist pattern from said transparent substrate, and performing said chemical and mechanical polishing for said surface of said phase shift pattern.

In accordance with a preferred embodiment of the present invention, a photomask fabrication method comprises the steps of forming a resist film on a transparent substrate, forming a desired pattern on said resist film by developing said resist film after said resist film is selectively exposed by using a radiation ray, forming hollow sections in said transparent substrate by selectively etching said transparent substrate by using said resist film as a mask, eliminating said resist film from said transparent substrate, forming a shade film in each of said hollow sections, performing a chemical and mechanical polishing for said shade film in order to form a shade pattern, forming a phase shift film on said transparent substrate, and forming a phase shift pattern by selectively etching said phase shift film by using said radiation ray.

In the photomask fabrication method as another preferred embodiment, after the step of forming said phase shift pattern by selectively etching said phase shift film by using said radiation ray, further comprises the step of performing said chemical and mechanical polishing for said phase shift pattern formed on said transparent substrate.

In accordance with a preferred embodiment of the present invention, a photomask fabrication method comprising the steps of forming a resist film on a transparent substrate, forming a desired pattern on said resist film by developing said resist film after said resist film is selectively exposed by using a radiation ray, forming hollow sections in said transparent substrate by selectively etching said transparent substrate by using said resist film as a mask, eliminating said resist film from said transparent substrate, forming a shade film in each of said hollow sections, performing a chemical and mechanical polishing for said shade film in order to form a shade pattern, forming a resist film on said transparent substrate in which said shade pattern has been formed, selectively etching said resist film by using said radiation ray, and selectively etching said transparent substrate.

In the photomask fabrication method as another preferred embodiment, after the step of selectively etching said transparent substrate by using said radiation ray, further comprises the step of performing said chemical and mechanical polishing for said transparent substrate.

In the photomask fabrication method as another preferred embodiment, one of an electron beam, a laser beam, and a monochromatic beam is used as said radiation ray.

In accordance with a preferred embodiment of the present invention, a fabrication method of semiconductor integrated circuits such as a liquid crystal display uses said photomask as described above is used.

In accordance with a preferred embodiment of the present invention, a fabrication method of semiconductor integrated circuits such as a liquid crystal display includes said photomask fabrication method according to claim 16 is included.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 4:
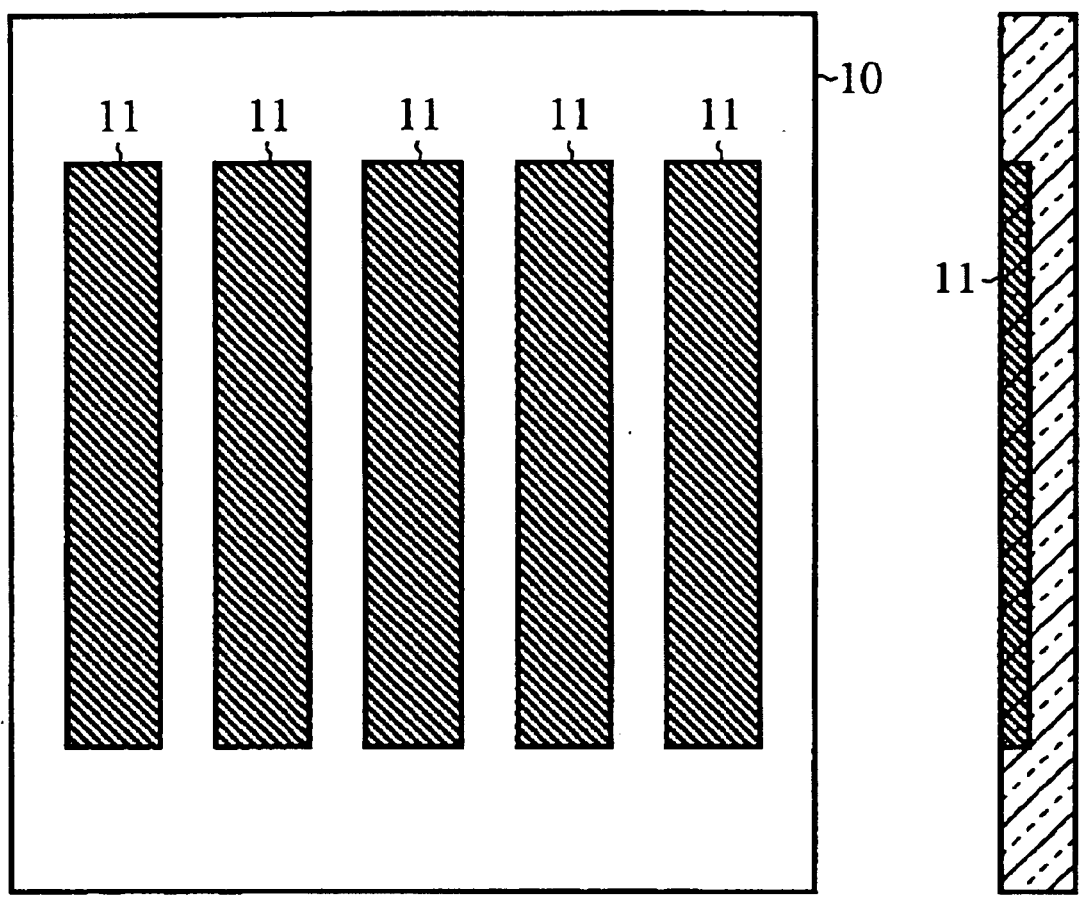
FIG. 4 is a diagram showing a photomask according to the first embodiment of the present invention.
Figure 4:
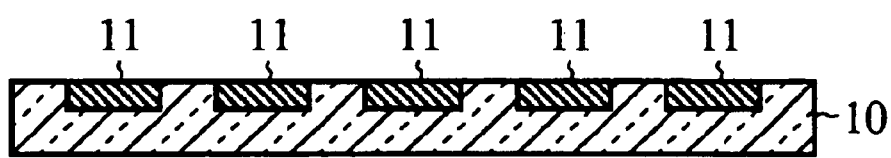

FIG. 4 is a diagram showing the photomask according to the first embodiment of the present invention. In FIG. 4, the reference number 10 designates a transparent substrate such as a transparent glass substrate and so on, 11 denotes shade patterns formed in hollow sections (or cavity sections) in the transparent glass section 10. In the fabrication process of the photomask having the configuration shown in FIG. 4, the shade film made up of a semiconductor material, a chromium Cr or a Molybdenum silicide MoSi is formed in each of the hollow sections. After this process, the chemical and mechanical polishing is performed to form a plane surface made up of the shade patterns 11 and the transparent glass substrate 10.

Figure 1A:
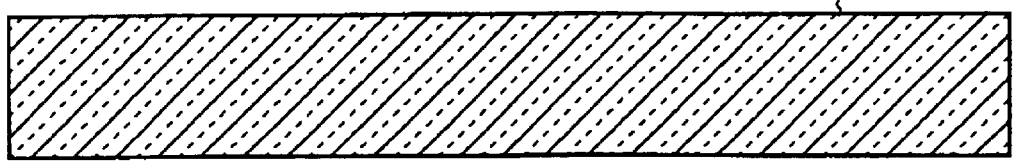
FIG. 1A to FIG. 1F are diagrams showing a conventional fabrication method of a conventional photomask.
Figure 1B:
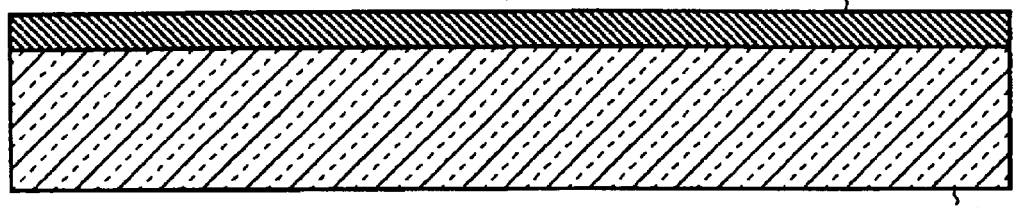
Figure 1C:
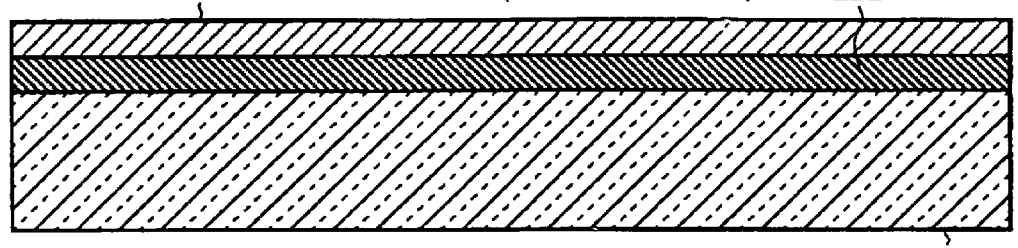
Figure 1D:
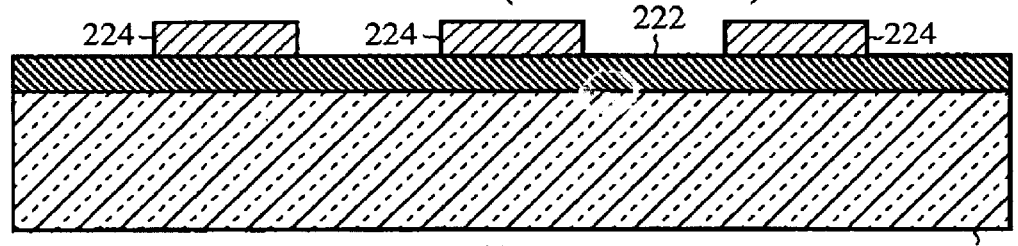
Figure 1E:
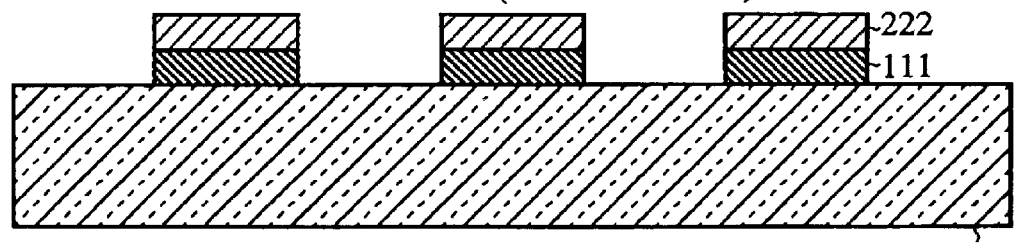
Figure 1F:
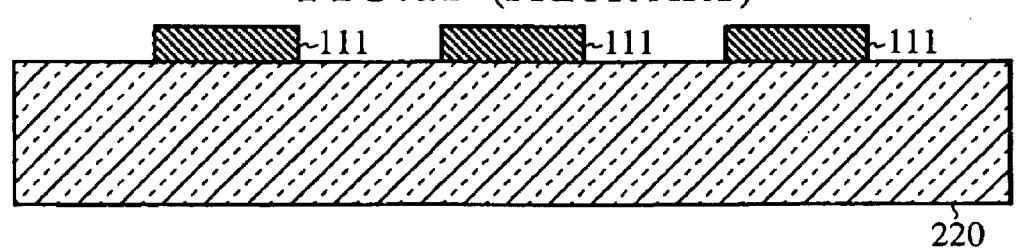

In the conventional photomask, shown in FIG. 1F, formed by the conventional fabrication method, because the shade pattern 111 is formed on the transparent glass substrate 220 and the surface of the photomask has a complicated pattern, there is a drawback that the conventional photomask has a lower mechanical durability during the washing process.

On the other hand, because the photomask according to the first embodiment of the present invention has the flat surface in which the shade patterns 11 are formed on the hollow sections and both the shade patterns 11 and the transparent glass substrate 10 are the same flat surface. Accordingly, the photomask of the first embodiment has no complicated topography and has a higher durability in chemical and mechanical polishing during the washing process.

As described above, according to the photomask of the first embodiment, because the shade pattern comprising shade films 11 is formed on the hollow sections and the shade patterns 11 and the transparent glass substrate 10 are the same flat surface, the surface of the photomask has no complicate topography, and the photomask is capable of increasing a durability to the chemical and mechanical polishing during the washing process. Therefore it is possible to increase the yield of semiconductor integrated circuits manufactured by using the photomask of the present invention.

Second Embodiment

FIG. 5A to FIG. 5F are diagrams showing the fabrication method of the photomask according to the second embodiment of the present invention. In FIG. 5A to 5F, the reference number 21 designates a resist film, 23 denotes a plurality of hollow sections (or cavity sections) formed in the transparent glass substrate 10 at desired intervals, and 24 indicates a shade film. Other components are the same as those of the photomask shown in FIG. 4 as the first embodiment, therefore the explanation of them is omitted here.

Next, a description will be given of the operation of the fabrication method of the photomask as the second embodiment.

The photomask shown in FIG. 4 is fabricated by the following fabrication processes.

Figure 5A:
FIG. 5A to FIG. 5F are diagrams showing a fabrication method of the photomask according to the first embodiment of the present invention.
Figure 5B:
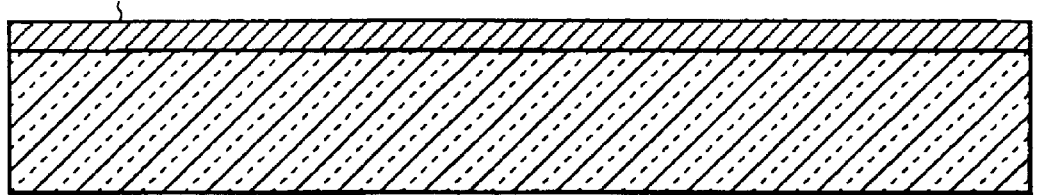

First, as shown in FIG. 5B, the resist film 21 is formed on the transparent glass substrate 10. When a selecting etching is performed, the resist film 21 is exposed by a radiation ray such as an electron beam, a laser beam, a monochromatic beam, and the like. In particular, the material of a resist film to be used for the fabrication process is changed according to the kind of the radiation ray. It is possible to use a monochromatic beam as the radiation ray during the exposure process. This can be used in the following explanation of the third to seventeenth embodiments according to the present invention.

Figure 5C:
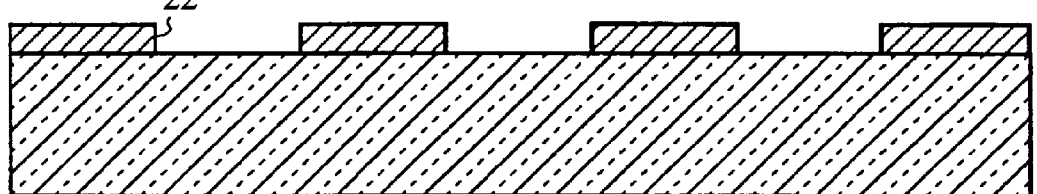
Figure 5D:
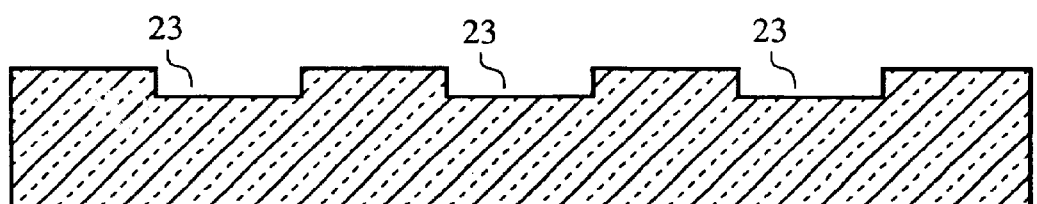

Next, as shown in FIG. 5C, the resist film 21 is selectively exposed by using the radiation ray such as the electron beam, the laser beam, or the monochromatic beam. After this process, the selected resist film 21 is developed by a developing solution, for example, a TMAH solution in order to form the resist pattern 22, shown in FIG. 5C.

Next, the selecting etching for the transparent glass substrate 10 is performed by using the resist pattern 22 as a mask. By the selection etching, the plurality of hollow section 23 are formed in the transparent glass substrate 10. After the selecting process, the shade film 24 made up of the material of a Chromium Cr or a Molybdenum silicide MoSi or others is formed on the transparent glass substrate 10 having the hollowing sections 23. Then, the chemical and mechanical polishing to the shade film 24 is so performed that both the transparent glass substrate 10 and the shade patterns 11 are the same surface. The fabrication process of the photomask is thereby completed.

Next, a description will be given of the chemical and mechanical polishing method to polish the shade film 24 formed on the transparent glass substrate 10 shown in FIG. 5E.

Figure 6:
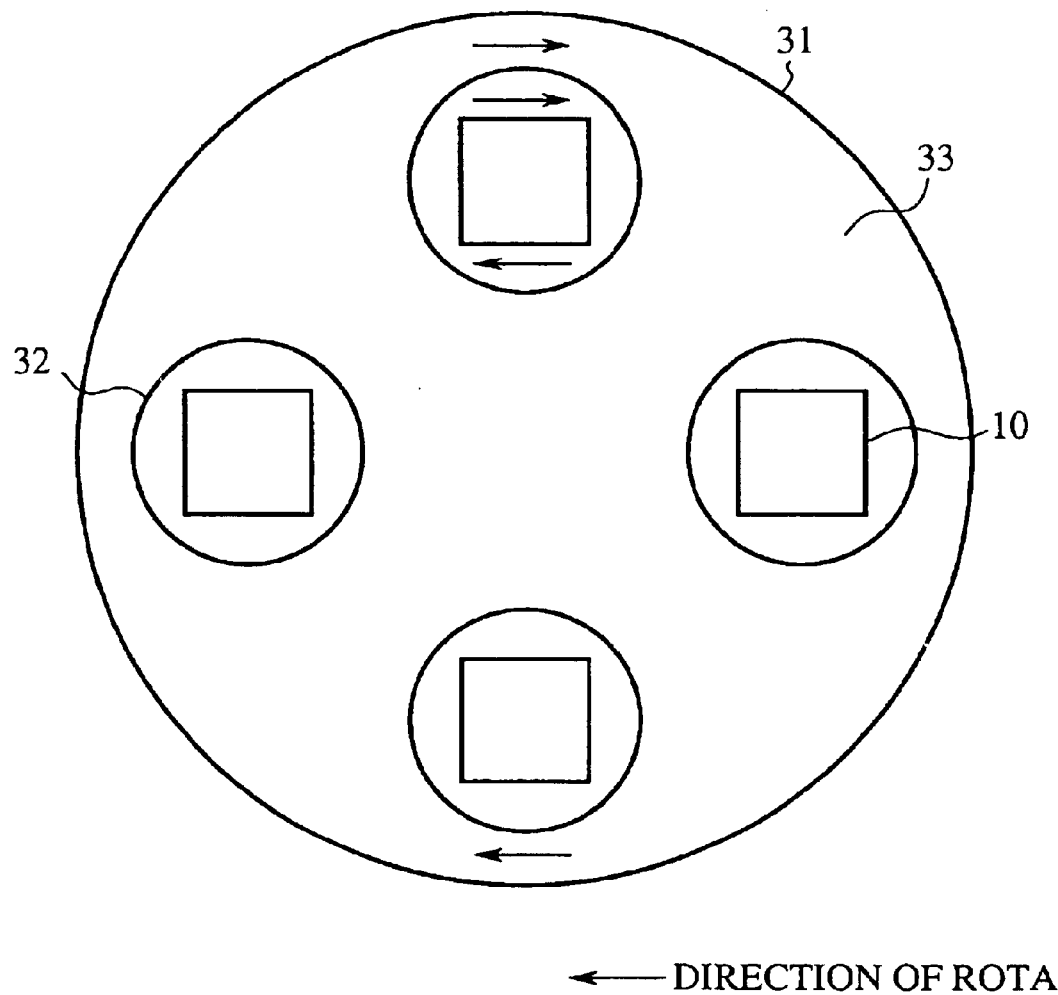
FIG. 6 is a diagram showing a polishing device to be used for a chemical and mechanical polishing process of a photomask.

FIG. 6 is a diagram showing a polishing device to be used during the chemical and mechanical polishing processes for polishing the shade film 24 in the photomask. In FIG. 6, the reference number 31 designates a rotation table, 32 denotes each mask holder for holding a photomask located on the rotation table 31. In FIG. 6, the four mask holders are placed on the rotation table 31. Each mask holders 32 rotates to a different direction when comparing with the direction of the rotation of the rotation table 31. The reference number 33 designates a polishing cloth on the rotation table 31. On the polishing cloth 33, there is a slurry including fine grains such as alumina (Aluminium oxide $Al_2O_3$) and silica (Silicon dioxide $S_1O_2$).

Figure 5E:
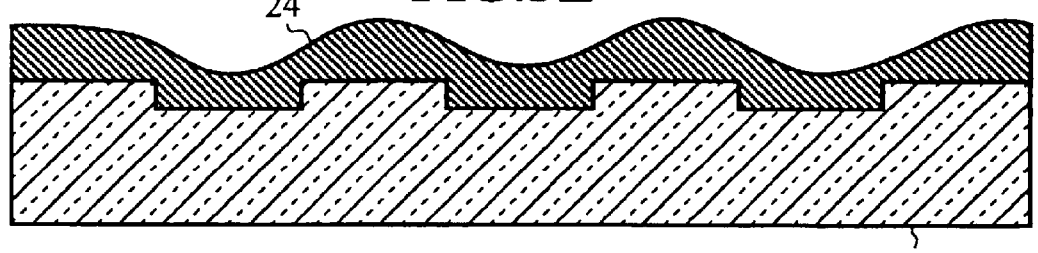

Each transparent glass substrate 10 shown in FIG. 5E is placed on each rotation table 31 so that the surface on which the shade film 24 is formed, namely a pattern surface of the transparent glass substrate 10, is faced to the polishing cloth 33. After the setting of the transparent glass substrate 31, the rotation table 31 is rotated to the direction designated by the arrows shown in FIG. 6. This rotation performs the polishing process. The degree of the polishing is adjusted by the pressure of each mask holder 32 to the rotation table 31, and the number of the rotation speed of each of the rotation table 31 and the mask holder 32. After the completion of the polishing process, both the shade sections 11 and the transparent glass substrate 10 have the same flat surface shown in FIG. 5F. The surface of the photomask becomes flat.

Figure 5F:
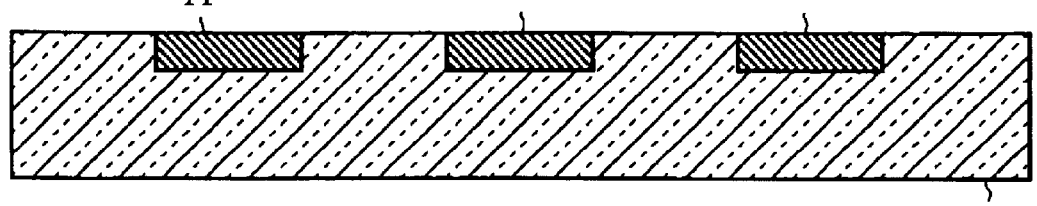
Figure 7A:
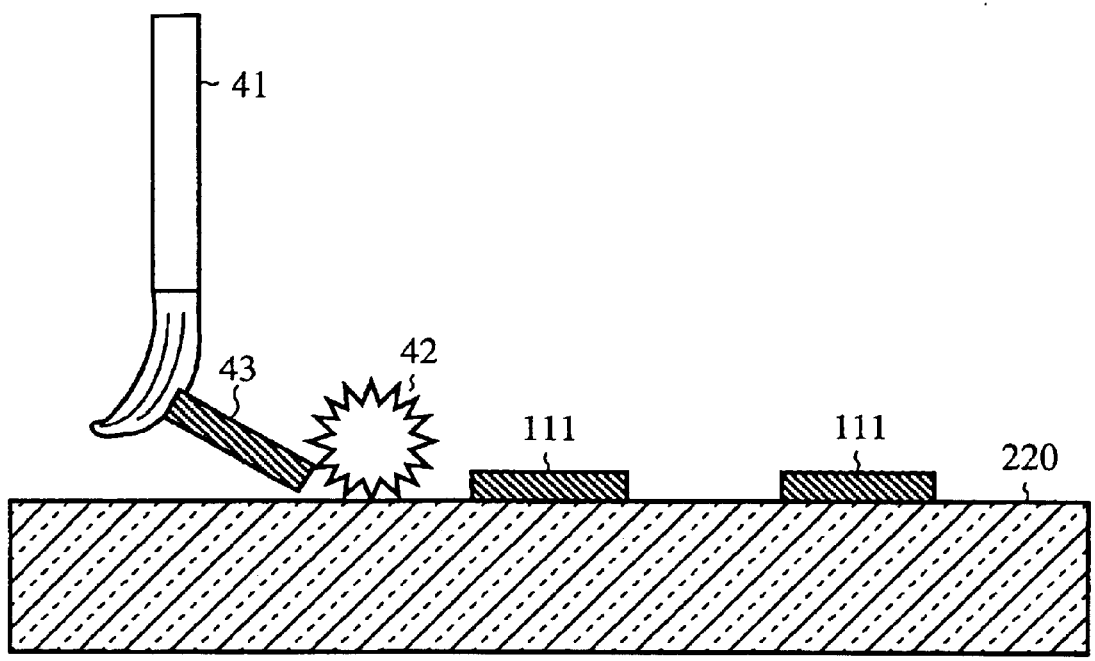
FIG. 7A and FIG. 7B are diagrams, each showing a washing process for washing a photomask.
Figure 7B:
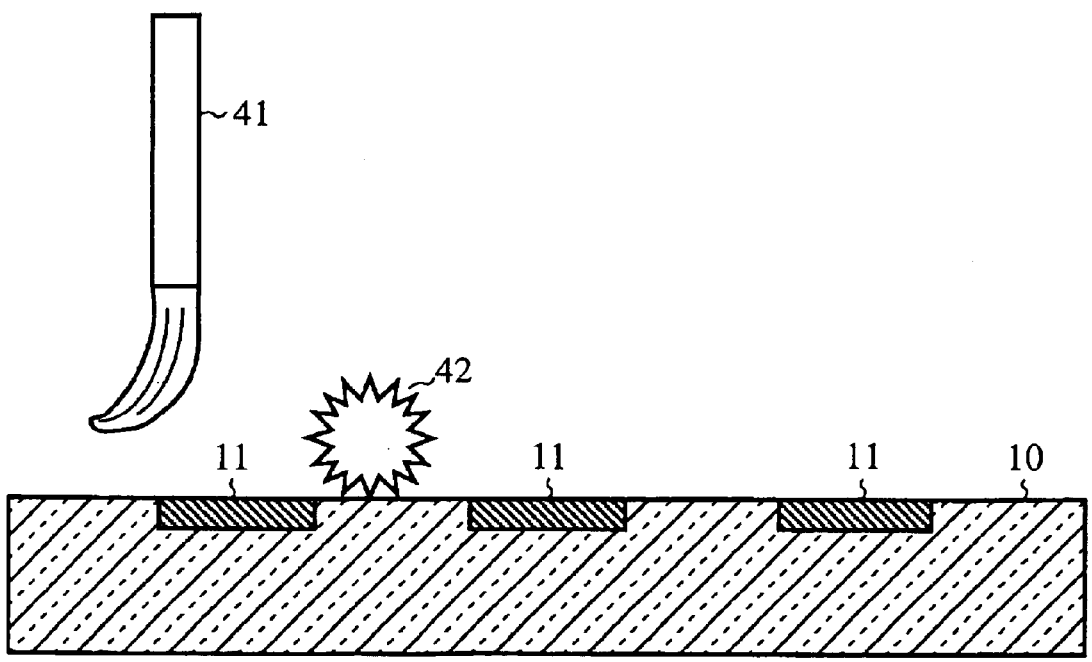

FIG. 7A is a diagram showing a washing process for washing a conventional photomask and FIG. 7B is a diagram showing the washing process for washing the photomask of the second embodiment shown in FIG. 5F. In FIG. 7A and FIG. 7B, the reference number 41 designates a blush, and 42 denotes a dust on the photomask to be eliminated during the washing process.

As shown in FIG. 7A, the photomask formed by the conventional fabrication process has a complicated topography in which the shade sections 111 are on the transparent glass substrate 220. In this configuration of the conventional photomask, the shade sections 111 are eliminated from the transparent glass substrate 220 by the mechanical stress such as the brush during the washing process. This causes pattern defects when the photomask in which one or more shade sections 111 are eliminated is exposed during the exposure process. That is, the quality of the photomask is decreased and the quality of semiconductor integrated circuits such as liquid crystal displays and so on manufactured by using the conventional photomask is also decreased. This causes to decrease the yield of the semiconductor integrated circuits.

On the other hand, as shown in FIG. 7B, because the photomask formed by using the fabrication process of the second embodiment has the flat surface, there is no mechanical stress such as the blush 41 during the washing process. This configuration of the photomask of the present invention can achieve a high quality. Further, the quality of the semiconductor integrated circuits such as liquid crystal displays and liquid crystal panels can be increased. This causes to increase the yield of the semiconductor integrated circuits.

As described above, according to the second embodiment, because it is possible to form the photomask having the flat surface, the quality of the photomask becomes high and it is also possible to increase the quality of semiconductor integrated circuits such as liquid crystal displays and liquid crystal panels manufactured by using the photomask. In addition to those features, it is possible to increase the yield of the semiconductor integrated circuits.

Third Embodiment

FIG. 8A to FIG. 8F are diagrams showing a fabrication method of the photomask according to the third embodiment of the present invention. In FIG. 8A to FIG. 8F, the reference number 50 designates a first reflection preventing film, and 51 denotes a second reflection preventing film. Other components are the same as those of the second embodiment, therefore the explanation of them is omitted here.

Next, a description will be given of the operation of the fabrication method of the photomask as the third embodiment.

Figure 8A:
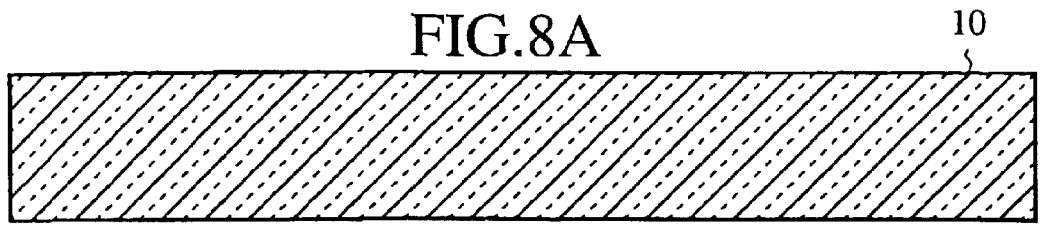
FIG. 8A to FIG. 8F are diagrams showing a fabrication method of the photomask according to the third embodiment of the present invention.
Figure 8B:
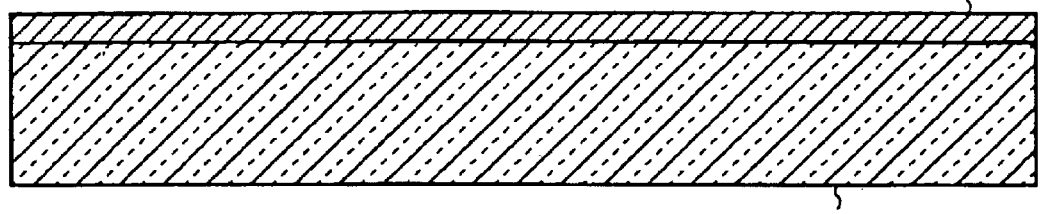
Figure 8C:
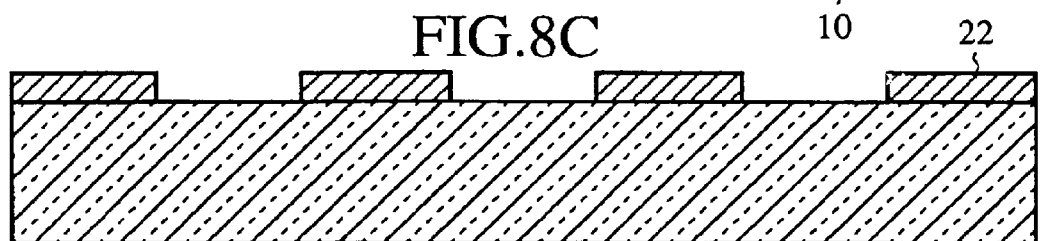
Figure 8D:
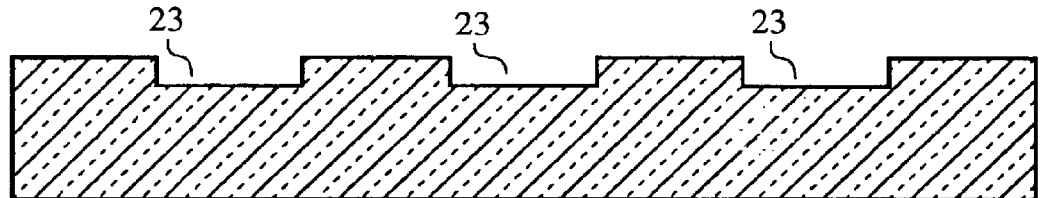
Figure 8E:
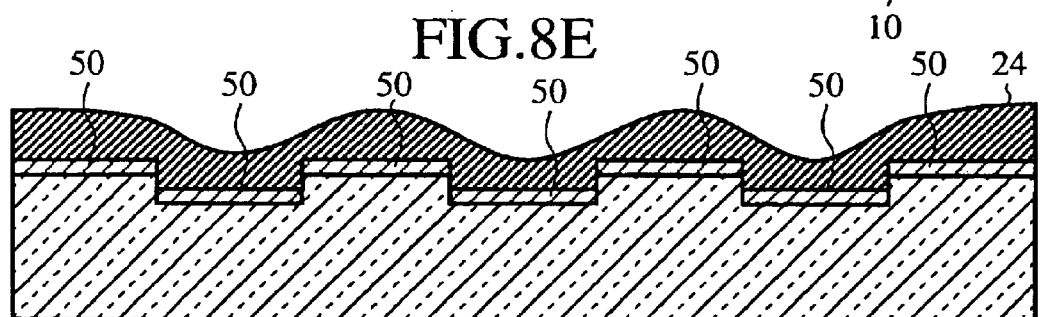

By using the fabrication method for the photomask of the third embodiment shown in FIG. 8A to FIG. 8D, the transparent glass substrate 10 is processed to form the hollow sections 23 (or cavity sections) on the transparent glass substrate 10 (see FIG. 8A to FIG. 8D). Following this, as shown in FIG. 8D, the first reflection preventing film 50 is formed on the hollow sections 23 and the transparent glass substrate 10, in particular, so that the first reflection preventing film 50 is not buried completely in each of the hollow sections 23 (see the first reflection film 50 shown in FIG. 8E). The shade films made up of a semiconductor material Cr or MoSi are then formed on the first reflection preventing film 50 in the hollow sections 23.

Figure 8F:
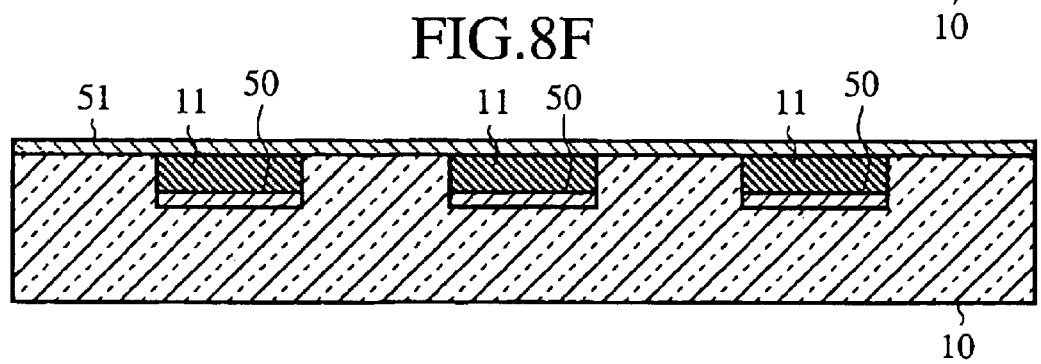

After this process, the chemical and mechanical polishing to the shade film 24 is performed to form a plane surface made up of the shade patterns 11 and the transparent glass substrate 10. That is, both the shade patterns 11 and the transparent glass substrate 10 have the same surface. Then, as shown in FIG. 8F, the second reflection preventing film 51 is formed on the shade patterns 11 and the transparent glass substrate 10.

The material of the second reflection preventing film 51 is a magnesium fluoride $MgF_2$ or a chromium monoxide CrO, and so on. In the configuration of the photomask shown in FIG. 8, both the first and second reflection preventing films 50 and 51 are formed. However, the present invention is not limited by this configuration, for example, it is acceptable to form one of them on or under the shade pattern 11.

Figure 2A:
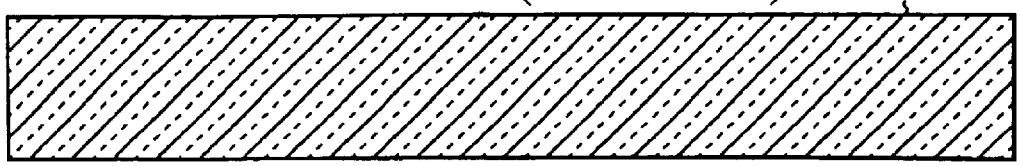
FIG. 2A to FIG. 2F are diagrams showing a conventional fabrication method of a conventional low reflecting photomask.
Figure 2B:
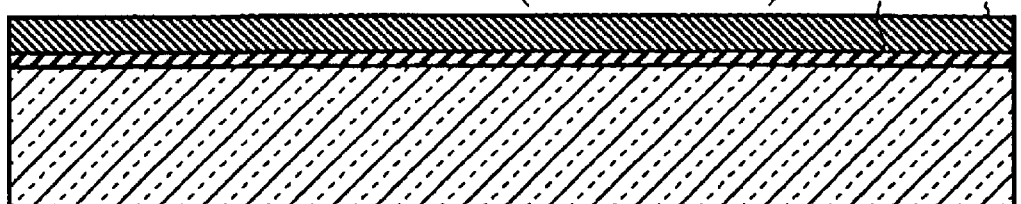
Figure 2C:
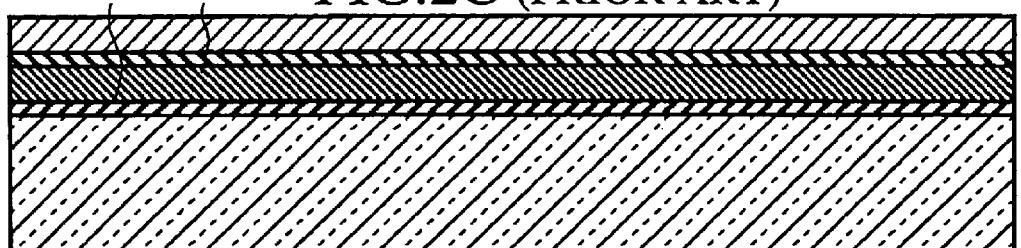
Figure 2D:
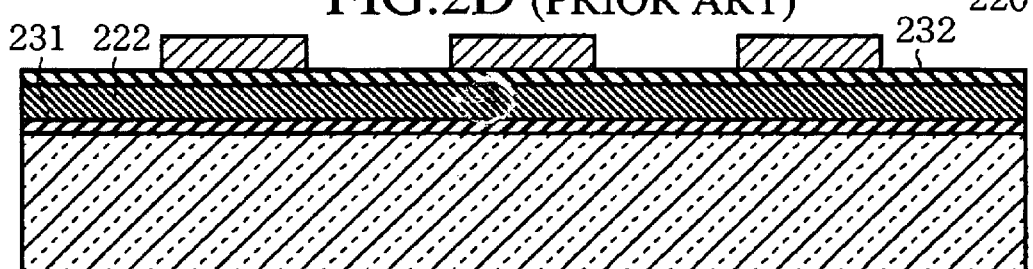
Figure 2E:
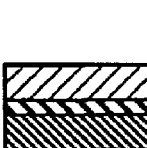
Figure 2F:

Because the conventional photomask of a low reflection type shown in FIG. 2F has a multi-layer configuration, it happens that the shade sections 111 are fallen or separated from the transparent glass substrate 220 by a brush to be used during a washing process to eliminate dusts. In other words, the conventional photomask has a lower durability during the photomask fabrication process. This drawback of the conventional photomask shown in FIG. 2F causes to decrease the quality of the photomask and to decrease the yield and quality of semiconductor integrated circuits manufactured by using the conventional photomask. On the other hand, the photomask of the third embodiment shown in FIG. 8F has the configuration in which the shade pattern 11 is formed in the transparent glass substrate 10, so that the photomask of the third embodiment has the large mechanical strength. Thus, the configuration of the photomask of the third embodiment contributes to decrease the occurrence of a structural defect of the shade pattern.

As described above, according to the third embodiment, the shade pattern 11 is formed on the transparent glass substrate 10 and the surface of the photomask is flat and the strength of the photomask to the mechanical stress becomes large. It is therefore possible to decrease the occurrence of the fault of the shade pattern 11 and to form the photomask with a high quality. Further, it is possible to increase the quality of semiconductor integrated circuits such as liquid crystal displays and liquid crystal panels manufactured by using this photomask. In addition to those features, it is possible to increase the yield of the semiconductor integrated circuits.

Fourth Embodiment

FIG. 9A to FIG. 9D are diagrams showing a fabrication method of the phase shift photomask according to the fourth embodiment of the present invention. In FIG. 9A to 9D, the reference number 60 designates a phase shift film coated with a shifter material. The reference number 61 denotes a shade pattern, and 62 designates a phase shift pattern. Other components are the same as those of the second embodiment, therefore the explanation of them is omitted here.

Next, a description will be given of the operation of the fabrication method of the photomask having the phase shift pattern as the fourth embodiment.

Figure 9A:
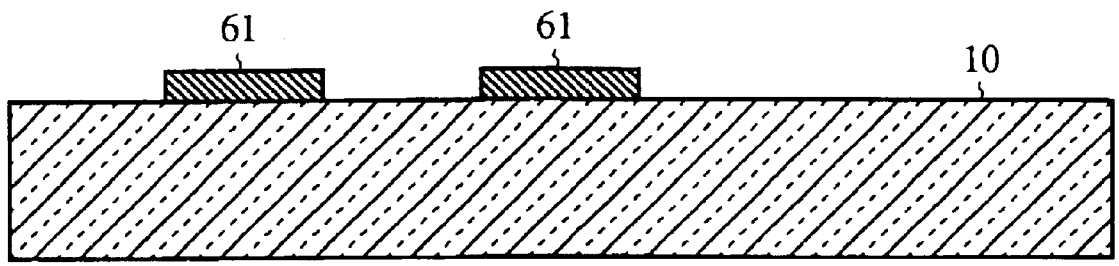
FIG. 9A to FIG. 9D are diagrams showing a fabrication method of the photomask according to the fourth embodiment of the present invention.
Figure 9B:
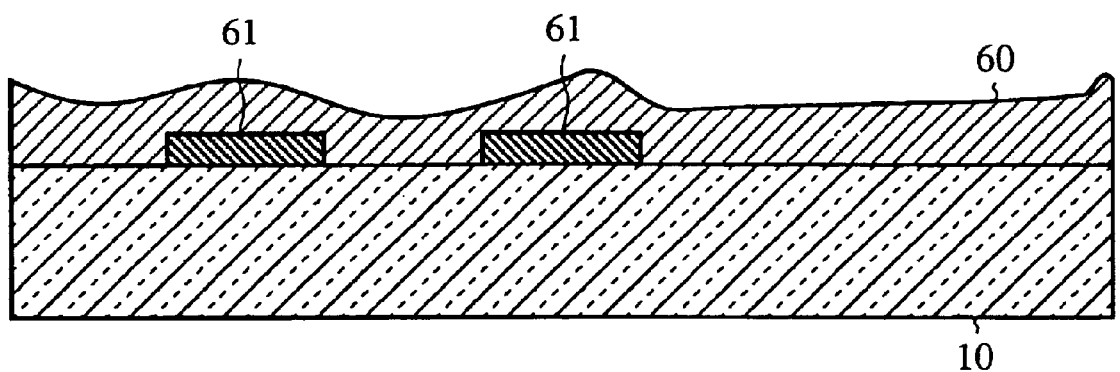
Figure 9C:
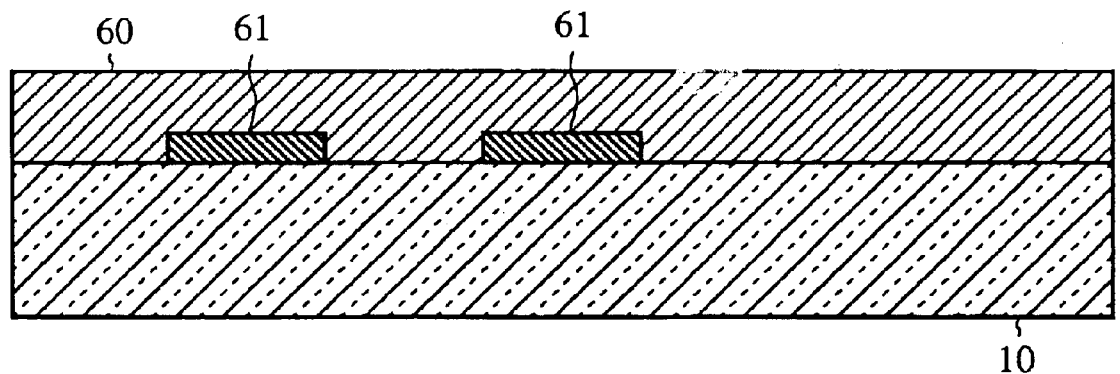
Figure 9D:
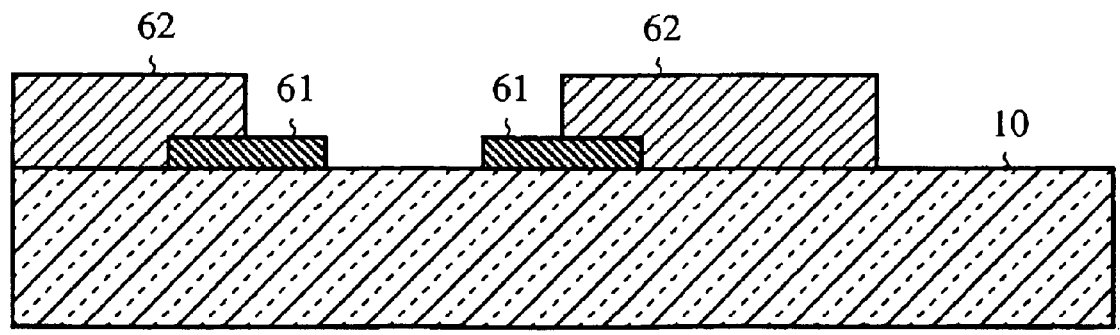

First, as shown in FIG. 9A, the shade pattern 61 is formed on the transparent glass substrate 10. After this process, the shifter material such as SOG (Spin On Glass) is coated on both the transparent glass substrate 10 and the shade pattern 61. The configuration of the phase shift film 60 formed by coating the shifter material has a waved-shape shown in FIG. 9B because the shifter material 60 is coated on a complicated topography of the shade pattern 61.

Next, the chemical and mechanical polishing is performed for the phase shift film 60 in order to obtain a flat surface of the phase shift film 60. After the completion of the polishing process, the phase shift film 60 is selectively etched (namely, a selection etching is performed for the phase shift film 60) in order to form the phase shift mask having the phase shift pattern 62 with a uniform thickness of each shifter shown in FIG. 9C.

Figure 3A:
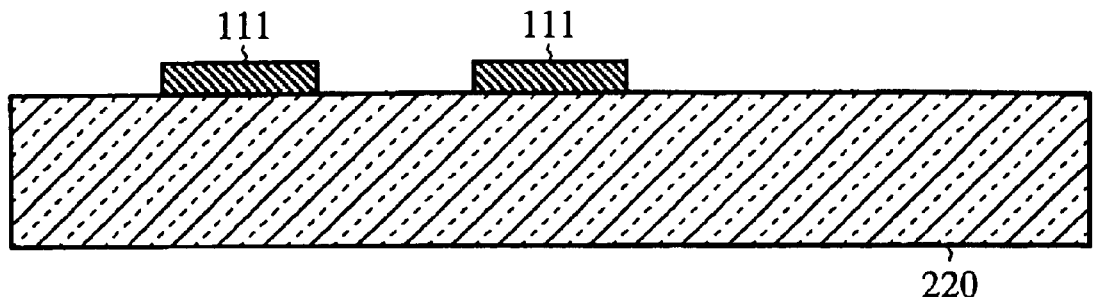
FIG. 3A to FIG. 3D are diagrams showing a conventional fabrication method of a conventional phase shift photomask.
Figure 3B:
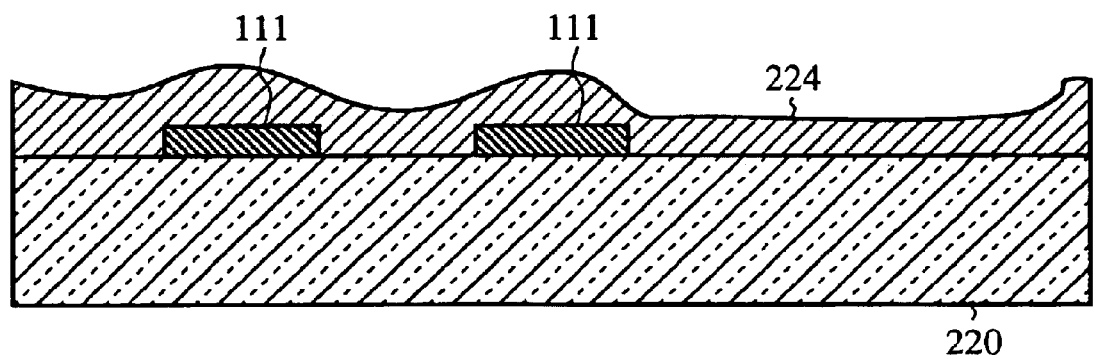
Figure 3C:
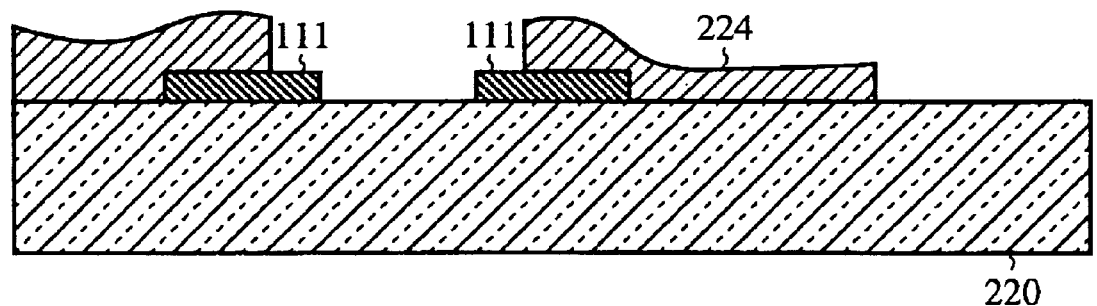

As shown in FIG. 3C, because the thickness of each shifter becomes partially high, namely, the thickness of each shifter does not uniform, the conventional phase shift photomask does not perform completely its function. On the other hand, the phase shift photomask fabricated by the fabrication method of the fourth embodiment can perform completely its function because the thickness of the shifters forming the phase shift pattern 62 is uniform.

As described above, because the fabrication method of the fourth embodiment can fabricate the phase shift pattern of a uniform thickness, it is possible to increase the contrast of an optical image of the phase shift photomask when semiconductor integrated circuits are fabricated by using the phase shift photomask.

Fifth Embodiment

FIG. 10A to FIG. 10D are diagrams showing a fabrication method of the photomask according to the fifth embodiment of the present invention. In FIG. 10A to FIG. 10D, the reference number 63 designates a phase shift pattern, and 70 denotes a boundary section between the phase shift pattern and the transparent glass substrate 10. Other components are the same as those of the fourth embodiment, therefore the explanation of them is omitted here.

Next, a description will be given of the operation of the fabrication method of the phase shift photomask of the fifth embodiment as a photomask.

Figure 10A:
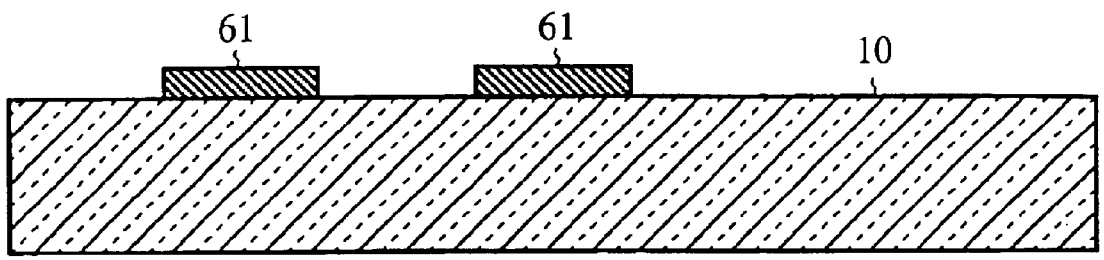
FIG. 10A to FIG. 10D are diagrams showing a fabrication method of the photomask according to the fifth embodiment of the present invention.
Figure 10B:
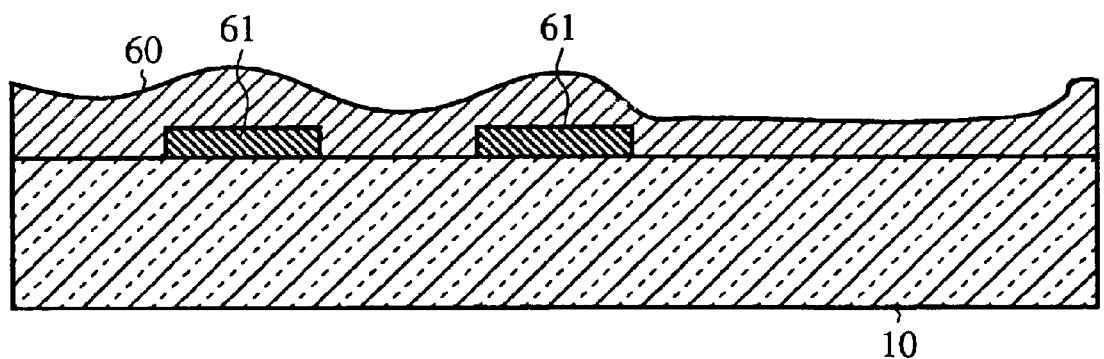

First, as shown in FIG. 1A and FIG. 10B, the shade pattern 61 is formed on the transparent glass substrate 10. Next, the phase shift film 60 is formed on both the shade pattern 61 and the transparent glass substrate 10 by using the fabrication process of the fourth embodiment shown in FIG. 9A and FIG. 9B.

Figure 10C:
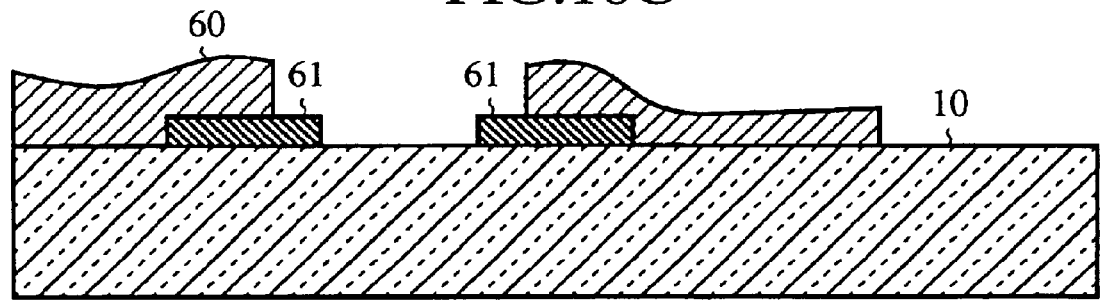

Next, as shown in FIG. 10C, after the phase shift film 60 is selectively etched, the chemical and mechanical polishing is performed so that the surface of the phase shift film 60 as the coated film becomes flat. Thereby, the photomask in which the surface of the phase shift pattern 63 becomes flat can be obtained. No phase error happens during the fabrication process for semiconductor integrated circuits by using the photomask obtained by the above processes.

Figure 10D:
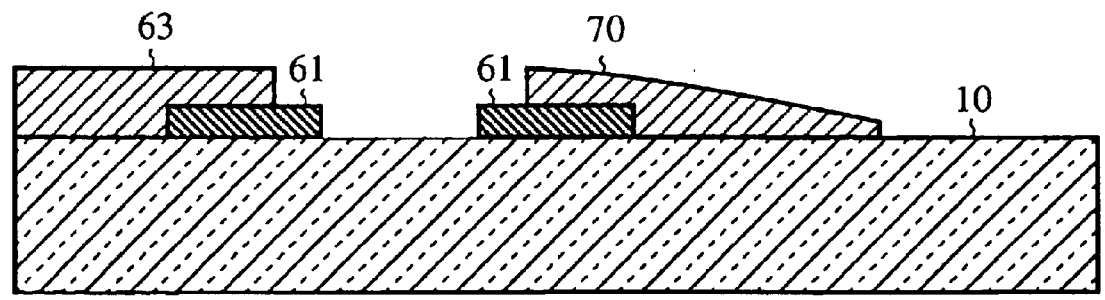

In addition, as shown in the right section in FIG. 10D, the boundary section 70 in the phase shift section adjacent to the shade pattern 61 has a sloped shape where the phase is gradually changed. Thus, by performing the chemical and mechanical polishing for the boundary section 70, an intermediate phase shifter can be formed in the boundary section 70. That is, the boundary section 70 becomes a faulty section of the phase shifter if no chemical and mechanical polishing is performed. However, no shade section is formed at the boundary section 70 by performing the chemical and mechanical polishing. Furthermore, as shown in FIG. 10D, no mechanical stress by the brush 41 (see FIG. 7A) happens during the washing process because the surface of the photomask has a unique topography, namely flat. This means the photomask of the fifth embodiment has a high durability during the washing process.

As described above, according to the fifth embodiment, it is possible to avoid the occurrence of the faulty phase shifter at the boundary section 70 in the photomask and to form the phase shift photomask having the configuration in which no shade section are formed at the boundary section 70. Therefore the topography of the surface of the photomask becomes flat. It is thereby possible to form the photomask having a high durability to the washing process.

Sixth Embodiment

FIG. 11A to FIG. 11E are diagrams showing the fabrication method of the photomask according to the sixth embodiment of the present invention. In FIG. 11A to 11E, the reference number 80 designates a resist film, 82 denotes a phase shift pattern, and 83 indicates a hollow section (or a cavity section). Other components are the same as those of the fifth embodiment, therefore the explanation of them is omitted here.

Next, a description will be given of the operation of the fabrication method of the photomask having the phase shift pattern as the sixth embodiment.

Figure 11A:
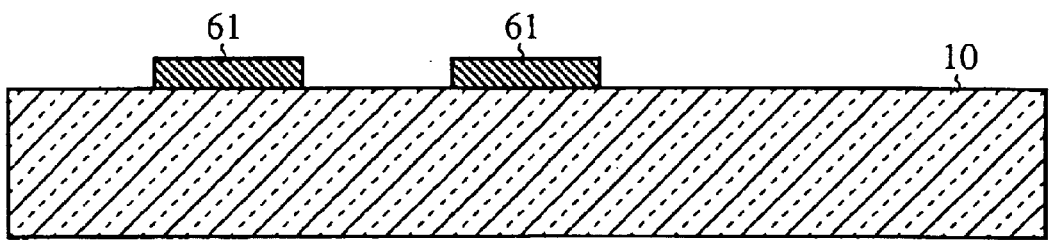
FIG. 11A to FIG. 11E are diagrams showing a fabrication method of the photomask according to the sixth embodiment of the present invention.
Figure 11B:
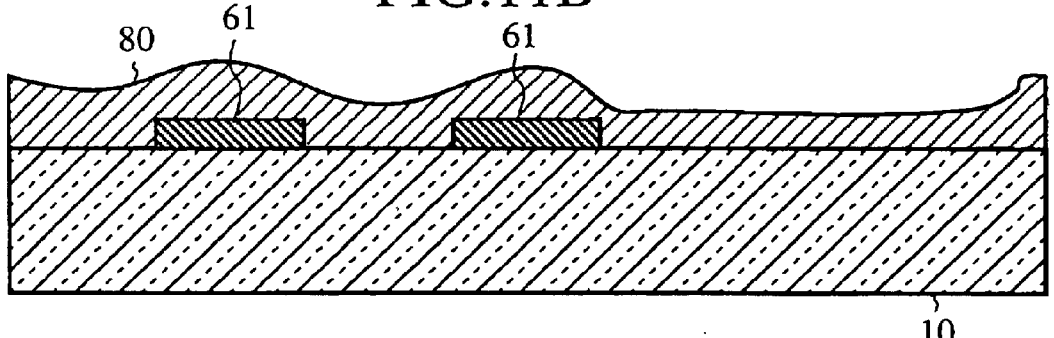

First, as shown in FIG. 11A, the shade pattern 61 is formed on the transparent glass substrate 10. Next, the resist film 80 is formed on both the shade pattern 61 and the transparent glass substrate 10. The resist film 80 has a complicated topography such as a convex shape because the shade pattern 61 is formed on the transparent glass substrate 10.

Figure 11C:
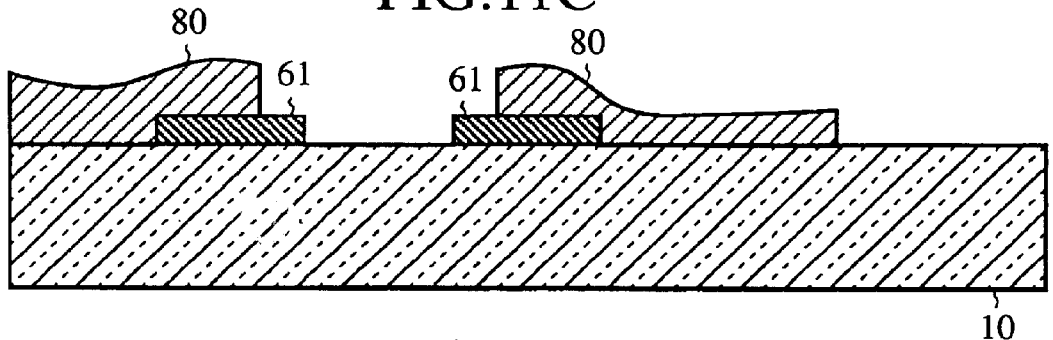
Figure 11D:
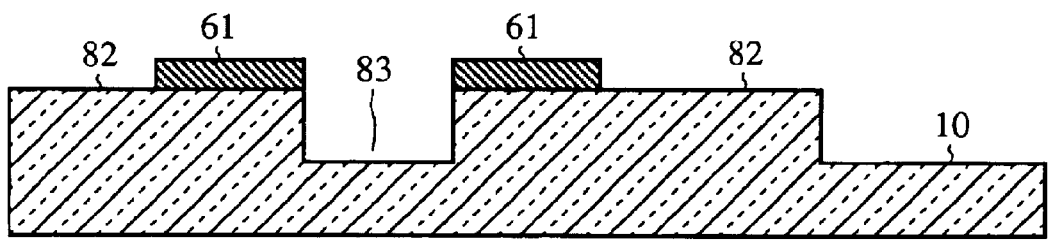
Figure 11E:
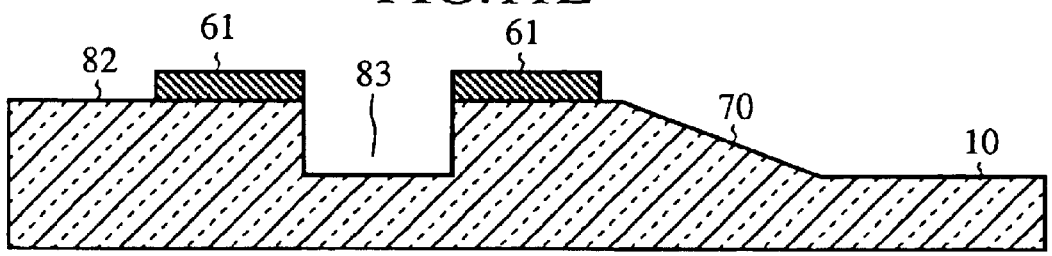

Next, as shown in FIG. 11C and FIG. 11D, the transparent glass substrate 10 is selectively etched by using the resist film 80 and the shade pattern 61 as a mask in order to form the hollow section 83 in the transparent glass section 10. In this configuration, the phase shift pattern 82 is formed at the section adjacent to the shade pattern 61.

Figure 3D:
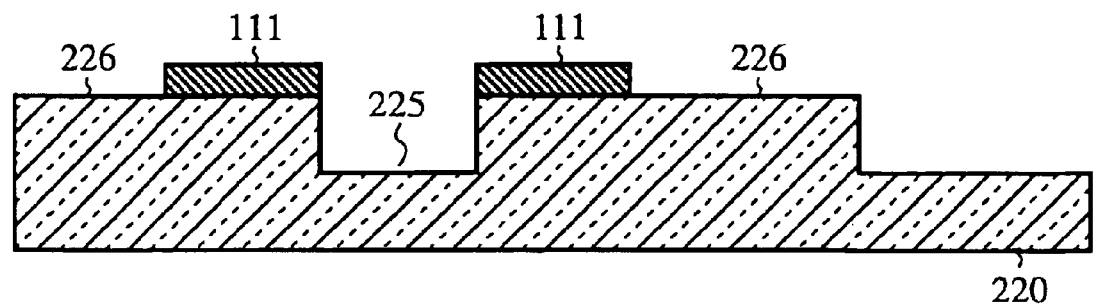

Next, the chemical and mechanical polishing is performed, so that the configuration of the boundary section 70 between the phase shift pattern 82 (see FIG. 11D) and the transparent glass substrate 10 (see FIG. 11D) becomes a sloped shape, as shown in FIG. 1E. In the boundary section 70 of the sloped shape, the phase is gradually changed. By performing the chemical and mechanical polishing for the boundary section 70, an intermediate phase shifter can be automatically formed in the boundary section 70. That is, the boundary section 70 becomes a faulty section of the phase shifter if no chemical and mechanical polishing is performed. However, no shade section is formed at the boundary section 70 by performing the chemical and mechanical polishing for the boundary section 70. Further, as shown in FIG. 1E, because the topography of the parts, where no phase shift section is formed, in the photomask fabricated by the fabrication method of the sixth embodiment is more flat when comparing with the conventional one shown in FIG. 3D, no mechanical stress by the brush 41 (see FIG. 7A) happens during the washing process. This means the photomask of the sixth embodiment has a high durability during the washing process.

As described above, according to the sixth embodiment, it is possible to avoid the occurrence to generate the faulty phase shifter at the boundary section 70, and it is possible to form the phase shift photomask having the configuration in which no shade section is formed at the boundary section 70 by performing the chemical and mechanical polishing. Therefore the topography of the surface of the photomask becomes flat when comparing with the conventional one. It is thereby possible to form the photomask having a high durability to the mechanical stress caused by the brush 41 (see FIG. 7A) during the washing process.

Seventh Embodiment

Figure 12A:
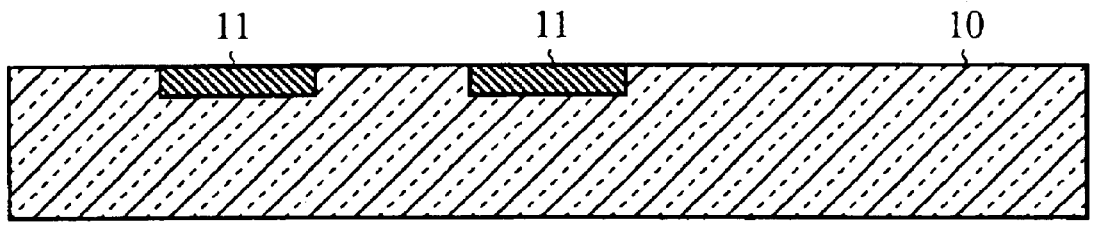
FIG. 12A to FIG. 12D are diagrams showing a fabrication method of the photomask according to the seventh and eighth embodiments of the present invention.
Figure 12B:
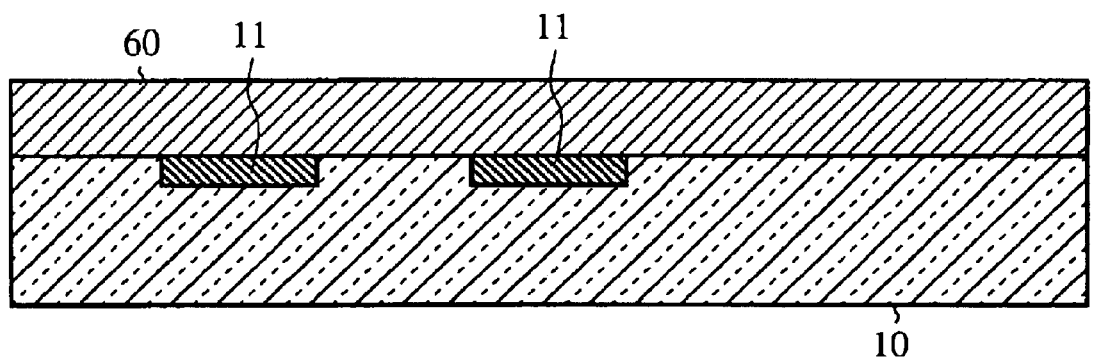

FIG. 12A and FIG. 12B are diagrams showing a fabrication method of the photomask according to the seventh embodiment of the present invention. In FIG. 12A and FIG. 12B, the reference number 63 designates a phase shift pattern. Other components are the same as those of the fifth embodiment, therefore the explanation of them is omitted here.

Next, a description will be given of the operation of the fabrication method of the photomask having the phase shift pattern as the seventh embodiment.

First, as shown in FIG. 12A, the shade pattern 11 is formed in the hollow section 11 (or the cavity section) formed in the transparent glass substrate 10 by the fabrication method of the second embodiment shown in FIG. 5A to FIG. 5F.

Next, the phase shift film 60 made up of a shifter material such as SOG (Spin on glass) is coated on both the transparent glass substrate 10 and the shade pattern 11. The surface of the phase shift film 60 formed by coating the shifter material becomes flat, as shown in FIG. 12B, because the surface of the transparent glass substrate 10 is flat.

Next, the chemical and mechanical polishing is performed for the phase shift film 60 in order to obtain the phase shift pattern 63 of a flat surface and a unique thickness.

As described above, according to the seventh embodiment, because the photomask having the phase shift pattern 63 can be formed on the photomask having the configuration of the first embodiment, it is possible to increase the contrast of an optical image of the phase shift photomask when semiconductor integrated circuits are fabricated by using the phase shift photomask of the seventh embodiment.

Eighth Embodiment

Figure 12C:
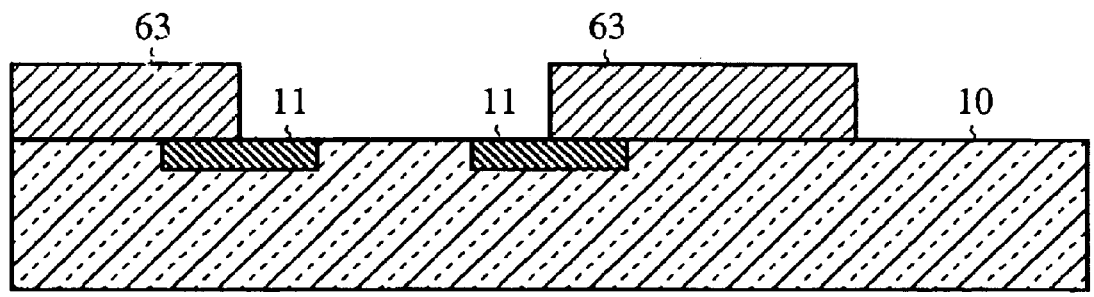
Figure 12D:
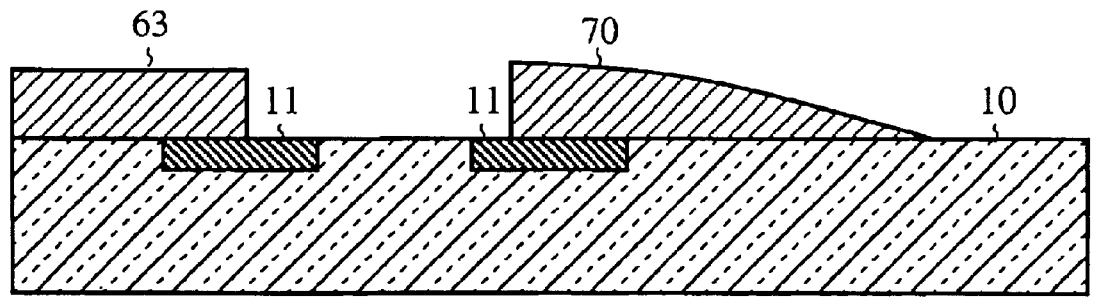

FIG. 12D is a diagram showing a fabrication method of the photomask according to the eighth embodiments of the present invention. In FIG. 12D, the reference number 70 designates a boundary section between the transparent glass substrate 10 and the phase shift pattern 63. Other components are the same as those of the seventh embodiment, therefore the explanation of them is omitted here.

Next, a description will be given of the operation of the fabrication method of the photomask having the phase shift pattern as the eighth embodiment.

After the fabrication process of the seventh embodiment shown in FIG. 12A to FIG. 12C, the chemical and mechanical polishing is further performed for the photomask shown in FIG. 12C, so that the configuration of the boundary section 70 between the phase shift pattern 63 (see FIG. 12C) and the transparent glass substrate 10 (see FIG. 12C) becomes a sloped shape, as shown in FIG. 12D. In the boundary section 70 of the sloped shape, the phase is gradually changed. By performing the chemical and mechanical polishing, an intermediate phase shifter can be automatically formed in the boundary section 70. That is, the boundary section 70 becomes a faulty section of the phase shifter if no chemical and mechanical polishing is performed. However, no shade section is formed at the boundary section 70 by performing the chemical and mechanical polishing. Further, as shown in FIG. 12D, because the topography of the photomask is more flat when comparing with the conventional one shown in FIG. 3D, no mechanical stress by the brush 41 (see FIG. 7A) happens during the washing process. This means the photomask of the eighth embodiment has a high durability during the washing process.

As described above, according to the eighth embodiment, because the photomask with the phase shift pattern can be formed on the configuration of the photomask of the first embodiment, it is possible to increase the contrast of an optical image when semiconductor integrated circuits are manufactured by using the photomask of the eighth embodiment. In addition, it is possible to form the photomask having a high durability to the mechanical stress caused by the brush 41 (see FIG. 7A) during the washing process because the topography of the surface of the photomask is flat when comparing with the conventional one.

Ninth Embodiment

FIG. 13A to FIG. 13D are diagrams showing the fabrication method of the photomask according to the ninth embodiment of the present invention. In FIG. 13A to FIG. 13D, the reference number 100 designates a resist film, 101 denotes a resist pattern, 102 indicates a phase shift pattern, and 103 designates a hollow section (or a cavity section). Other components are the same as those of the sixth embodiment, therefore the explanation of them is omitted here.

Next, a description will be given of the operation of the fabrication method of the photomask having the phase shift pattern as the ninth embodiment.

Figure 13A:
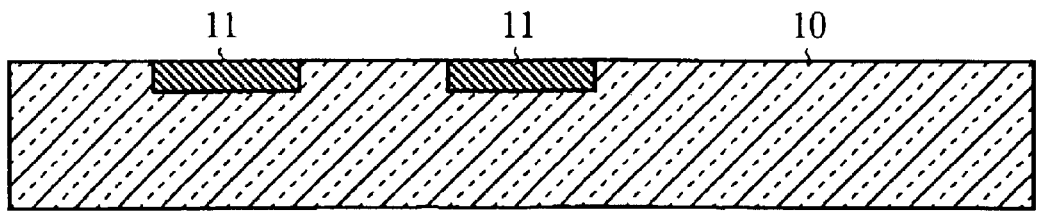
FIG. 13A to FIG. 13E are diagrams showing a fabrication method of the photomask according to the ninth and tenth embodiments of the present invention.

First, the photomask having a flat surface including the shade pattern 11 formed in the hollow section shown in FIG. 13A is fabricated by using the fabrication method of the second embodiment shown in FIG. 5A to FIG. 5F.

Figure 13B:
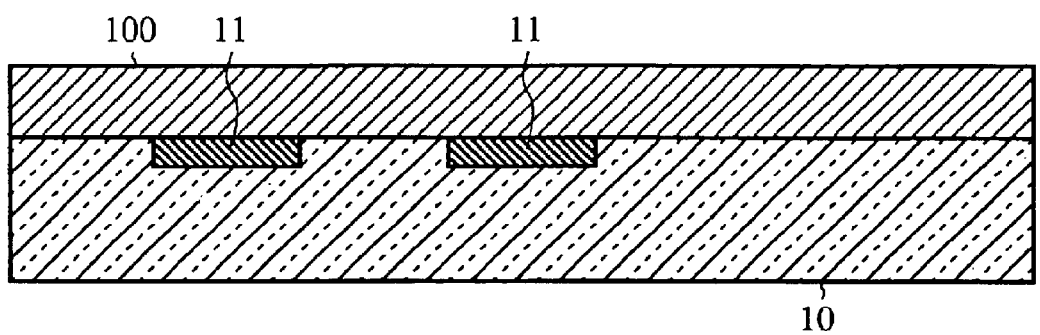

Next, as shown in FIG. 13B, the resist film 100 is coated on the transparent glass substrate 10 in which the shade pattern 11 is formed. Because the photomask fabricated by the fabrication method of the present invention includes the shade pattern 11 formed in the hollow section and the surface of the photomask is flat, the surface of the resist film 100 becomes flat.

On the other hand, because the shade pattern 111 formed on the transparent glass substrate 220 in the conventional photomask fabricated by the conventional fabrication process has a complicated topography, the surface of the resist film 224 has also a complicated shape.

Figure 13C:
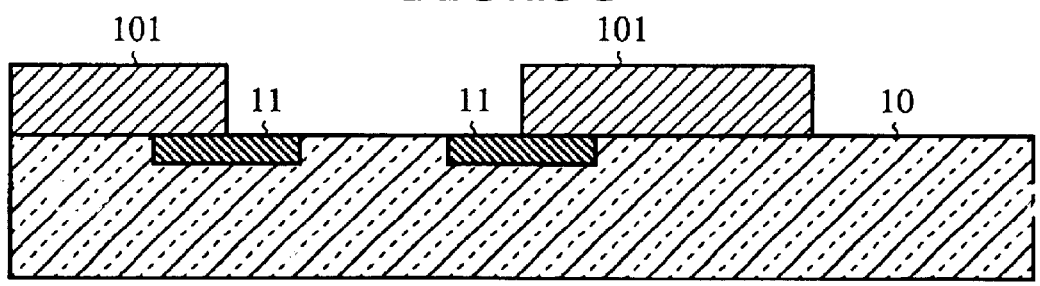
Figure 13D:
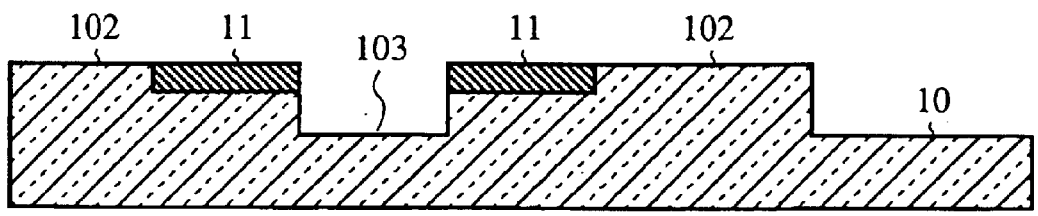

Next, when the resist film 100 obtained by the fabrication process shown in FIG. 13B is developed in order to form the resist pattern 101 shown in FIG. 13C. Then, the transparent glass substrate 10 is selectively etched by using the resist pattern 101 and the shade pattern 11 as a mask, so that the phase shift pattern 102 having the hollow section 103 shown in FIG. 13D is formed.

As described above, according to the ninth embodiment, because it is possible to form the photomask having the phase shift pattern on the configuration of the photomask as the first embodiment, it is possible to increase the contrast of an optical image when semiconductor integrated circuits are manufactured by using the photomask of the ninth embodiment. In addition, it is possible to form the photomask having a high durability to the mechanical stress caused by the brush 41 (see FIG. 7A) during the washing process because the topography of the surface of the photomask is flat when comparing with the conventional one.

Tenth Embodiment

Figure 13E:
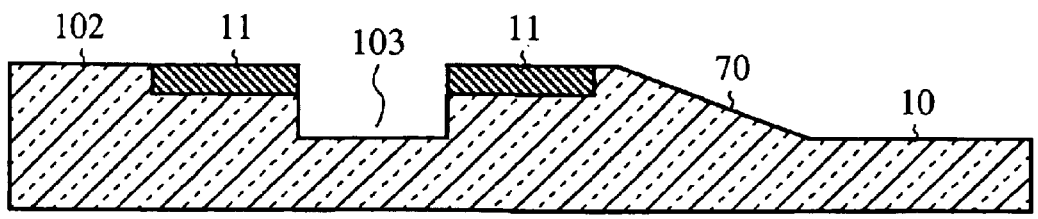

FIG. 13E is a diagram showing a fabrication method of the photomask according to the tenth embodiments of the present invention. In FIG. 13E, the reference number 70 designates a boundary section between the transparent glass substrate 10 and the phase shift pattern 102. Other components are the same as those of the ninth embodiment, therefore the explanation of them is omitted here.

Next, a description will be given of the operation of the fabrication method of the photomask having the phase shift pattern as the tenth embodiment.

After the fabrication process of the ninth embodiment shown in FIG. 13A to FIG. 13D, the chemical and mechanical polishing is further performed for the photomask shown in FIG. 13D, so that the configuration of the boundary section 70 between the phase shift pattern 102 (see FIG. 13D) and the transparent glass substrate 10 (see FIG. 13D) becomes a sloped shape, as shown in FIG. 13E. In the boundary section 70 of the sloped shape, the phase is gradually changed. By performing the chemical and mechanical polishing for the boundary section 70, an intermediate phase shifter can be automatically formed in the boundary section 70. That is, the boundary section 70 becomes a faulty section of the phase shifter if no chemical and mechanical polishing is performed. However, no shade section is formed at the boundary section 70 by performing the chemical and mechanical polishing for the boundary section 70. In addition, as shown in FIG. 13E, because the topography of the photomask is more flat when comparing with the conventional one shown in FIG. 3D, no mechanical stress by the brush 41 (see FIG. 7A) happens during the washing process. This means the photomask of the tenth embodiment has a high durability during the washing process.

As described above, according to the tenth embodiment, because the photomask with the phase shift pattern can be formed on the configuration of the photomask of the ninth embodiment, it is possible to increase the contrast of an optical image when semiconductor integrated circuits are manufactured by using the photomask of the tenth embodiment. In addition, it is possible to form the photomask having a high durability to the mechanical stress caused by the brush 41 (see FIG. 7A) during the washing process because the topography of the surface of the photomask is flat when comparing with the conventional one.

Eleventh Embodiment

FIG. 14A to FIG. 14H are diagrams showing photomasks, each has a phase shift pattern of Levenson's type. In particular, FIG. 14B to FIG. 14D and FIG. 14F show the photomasks having the phase shift pattern of Levenson's type that can be fabricated only by using the fabrication methods of the second embodiment to the tenth embodiment of the present invention. In addition, FIG. 14A, FIG. 14E, FIG. 14G, and FIG. 14H show the photomasks of Levenson's type fabricated by using the conventional fabrication methods. In the eleventh embodiment, each component is the same as each component shown in the first to tenth embodiments, therefore the explanation of them is omitted here.

Next, a description will be given of the operation of the photomasks having the phase shift pattern of Levenson's type as the eleventh embodiment.

In the photomask having a phase shift pattern, the principle of an image formation of a radiation ray and the effect thereof are generally changed according to the arrangement of a phase shift section where the phase shift pattern is formed, a shade section where the shade pattern is formed, and a transparent section through which the radiation ray is passed.

When comparing with the conventional photomask having the phase shift pattern of a Levenson's type, the structure of the photomask having the phase shift pattern of the Levenson's type as the eleventh embodiment shown in FIG. 14B to FIG. 14D and FIG. 14F has the unique thickness of the phase shifter and the surface of the photomask is flat. Therefore the topography of the surface of the photomask shown in each of FIG. 14B to FIG. 14D and FIG. 14F is more flat when comparing with that of the photomask shown in each of FIG. 14A, FIG. 14E, FIG. 14G, and FIG. 14G. Thereby, the function of the phase control can be increased and the contrast of the optical image can also be increased. In addition to this features, no mechanical stress happens by the brush 41 (see FIG. 7A) during the washing process. This means the photomasks of the eleventh embodiment shown in FIG. 14B to FIG. 14D and FIG. 14F has a high durability.

Figure 14A:
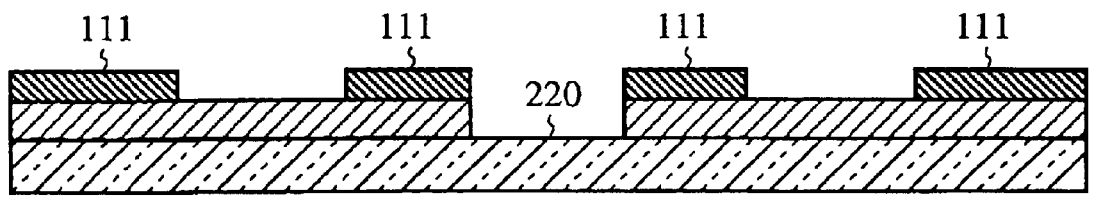
FIG. 14A to FIG. 14H are diagrams showing photomasks, each having a phase shift pattern of Levenson's type according to the eleventh embodiment of the present invention.
Figure 14B:
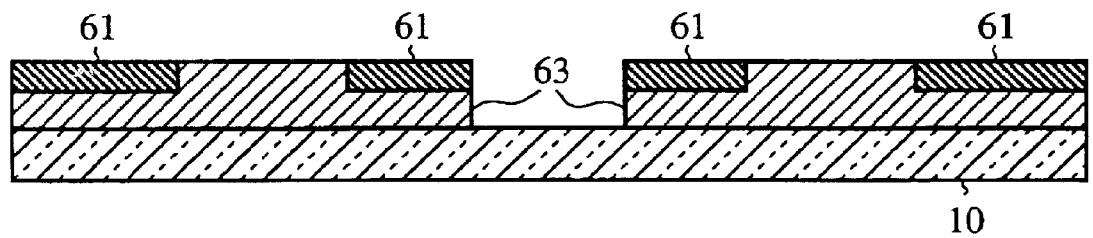
Figure 14C:
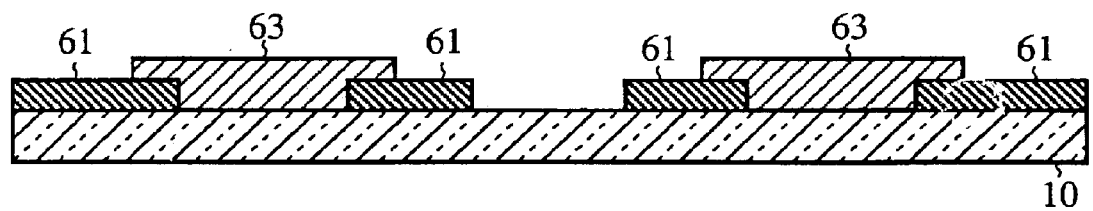
Figure 14D:
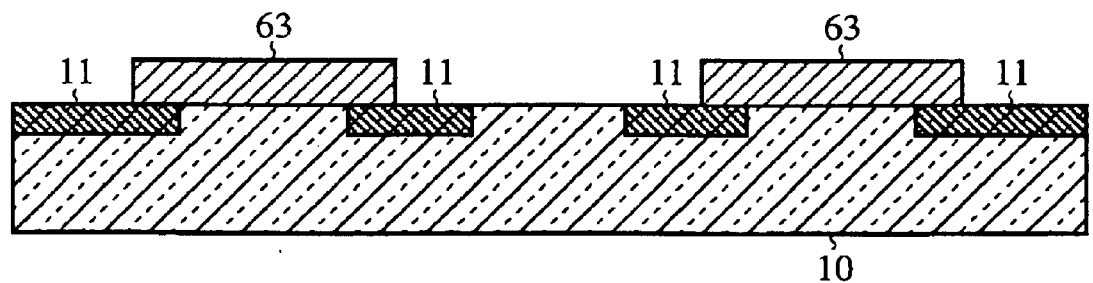
Figure 14E:
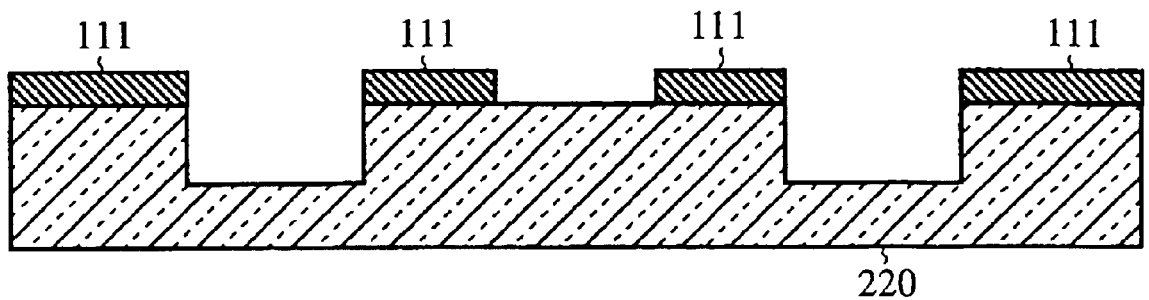
Figure 14F:
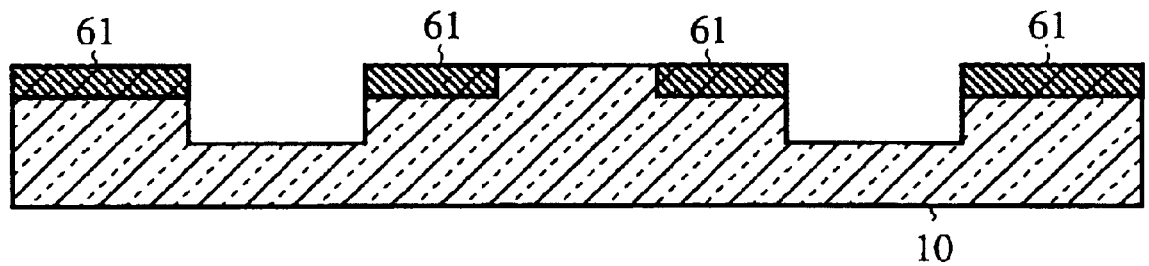
Figure 14G:
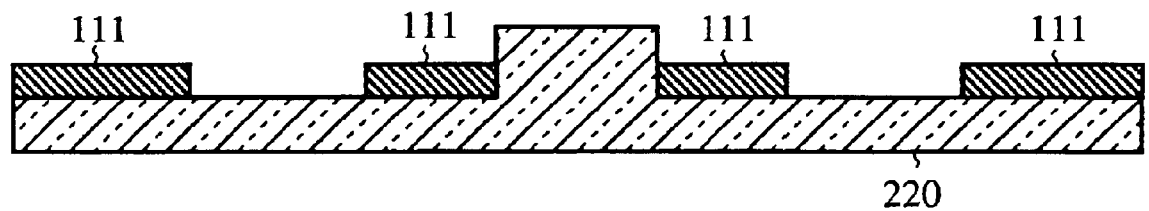
Figure 14H:
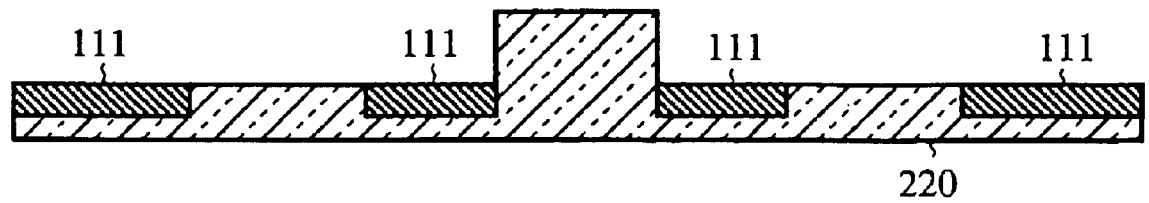
Figure 15A:
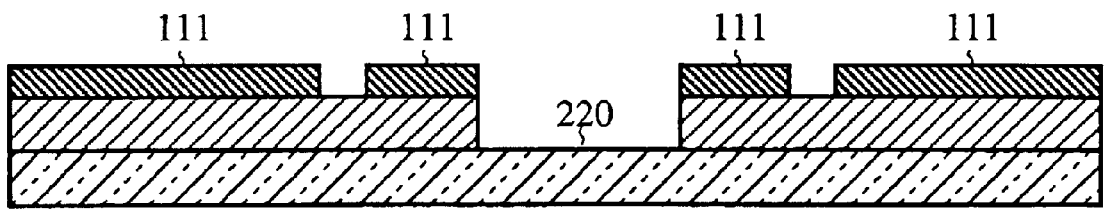
FIG. 15A to FIG. 15H are diagrams showing photomasks, each having a phase shift pattern of an auxiliary shifter type according to the twelfth embodiment of the present invention.
Figure 15B:
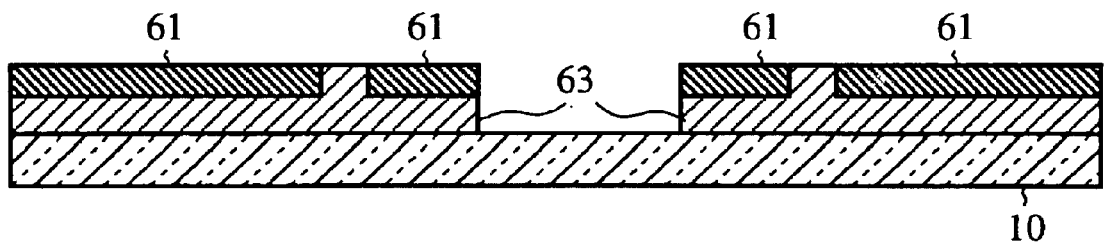
Figure 15C:
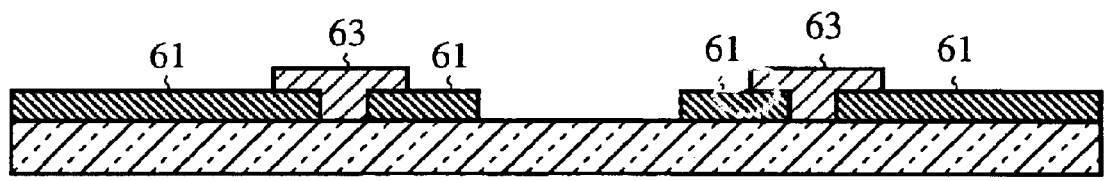
Figure 15D:
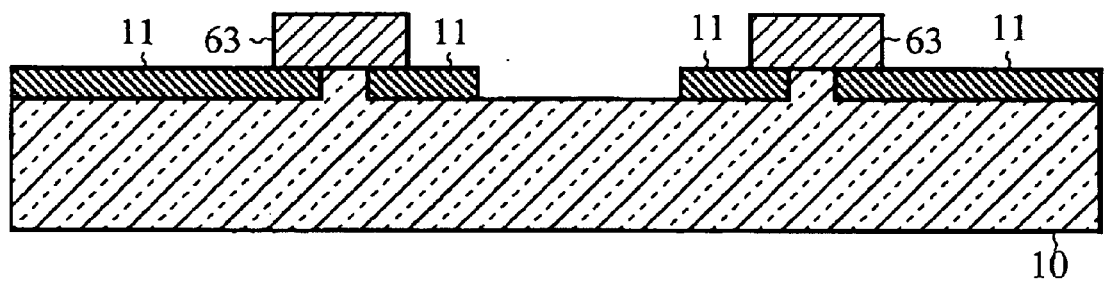
Figure 15E:
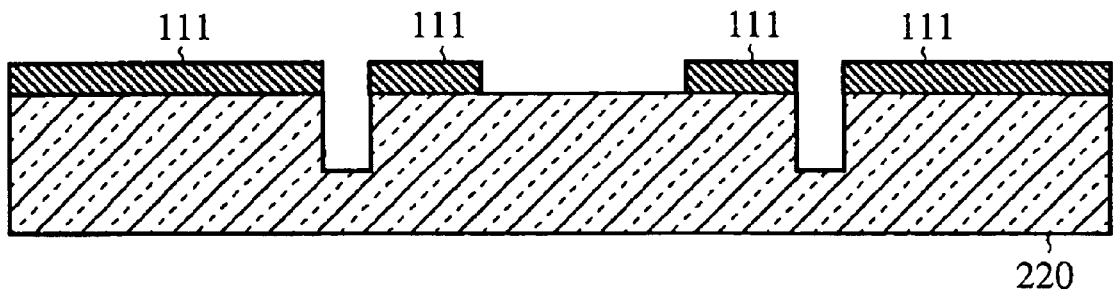
Figure 15F:
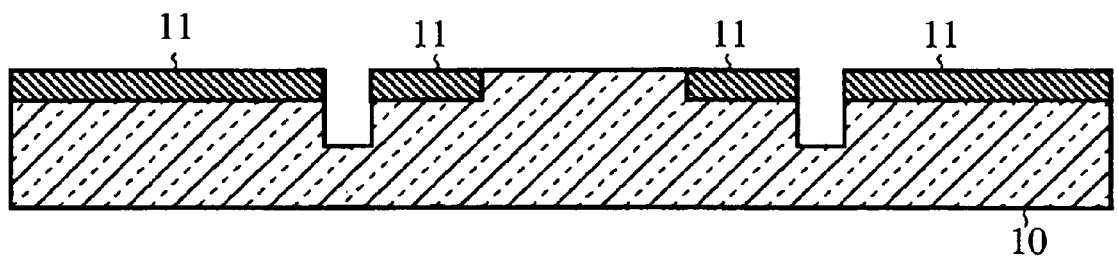
Figure 15G:
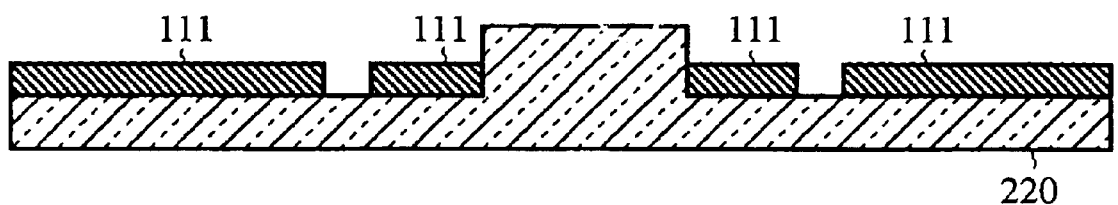
Figure 15H:
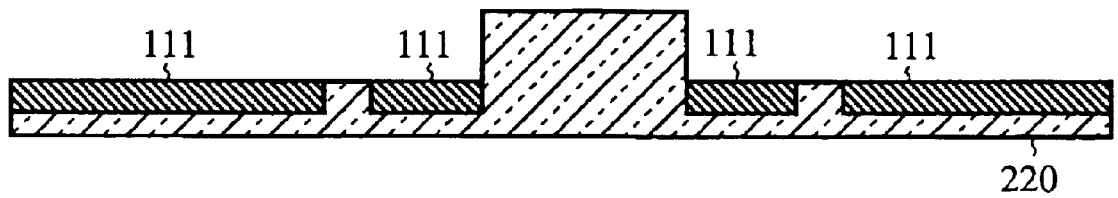
Figure 16A:
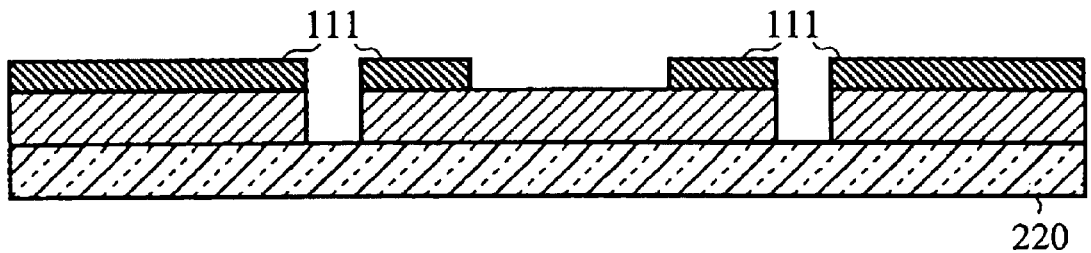
FIG. 16A to FIG. 16H are diagrams showing photomasks, each having the phase shift pattern of an auxiliary shifter type according to the twelfth embodiment of the present invention.
Figure 16B:
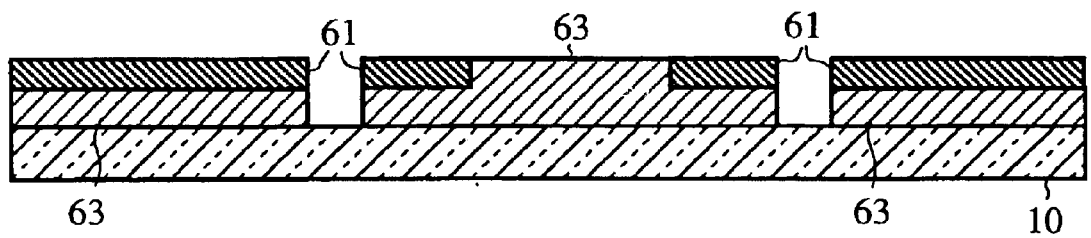
Figure 16C:
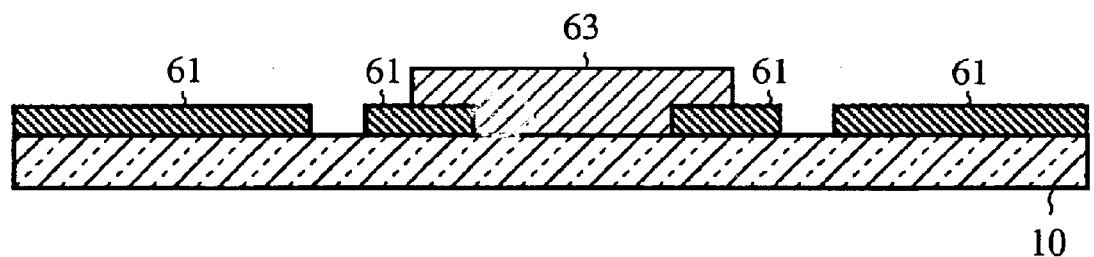
Figure 16D:
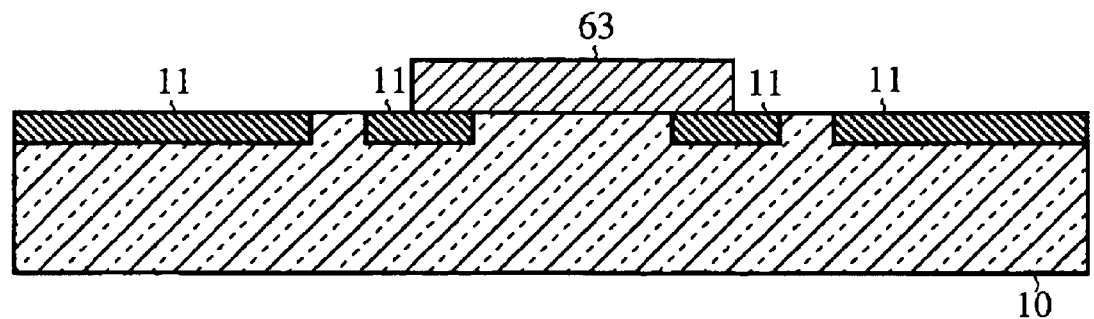
Figure 16E:
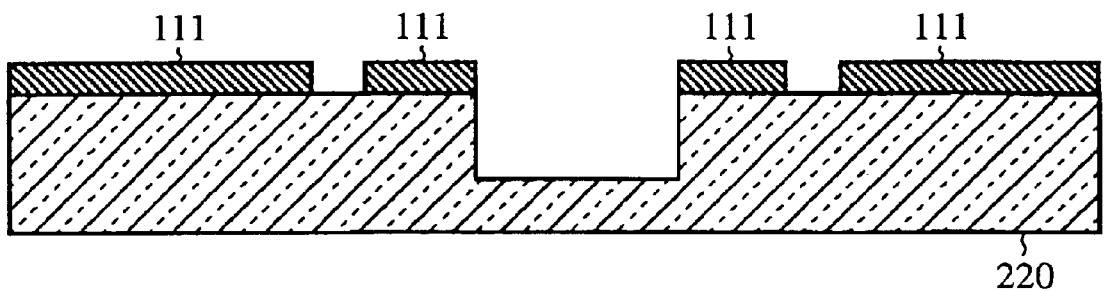
Figure 16F:
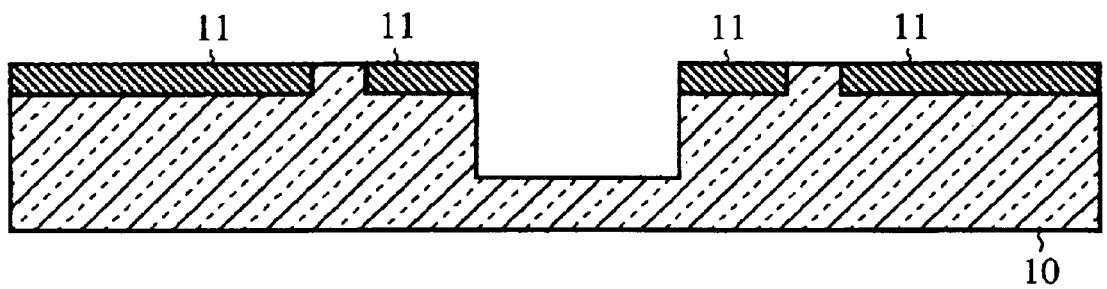
Figure 16G:
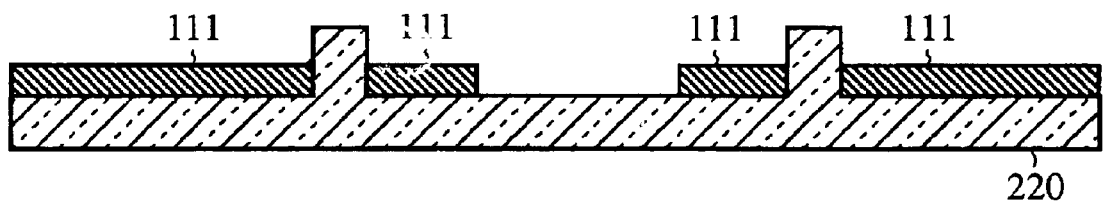
Figure 16H:
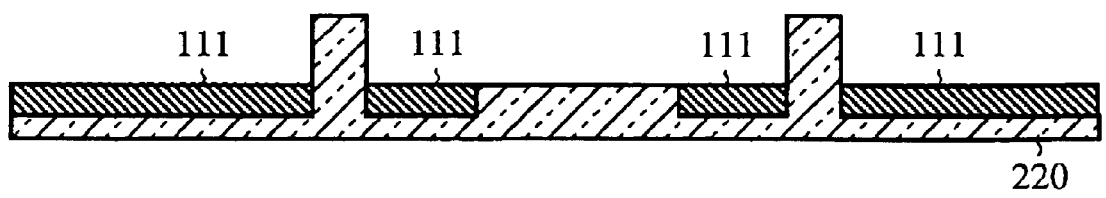
Figure 17A:
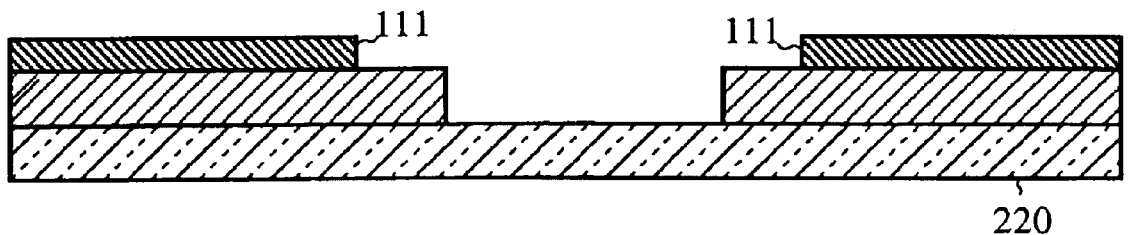
FIG. 17A to FIG. 17H are diagrams showing photomasks, each having a phase shift pattern of an edge highlighting type according to the thirteenth embodiment of the present invention.
Figure 17B:
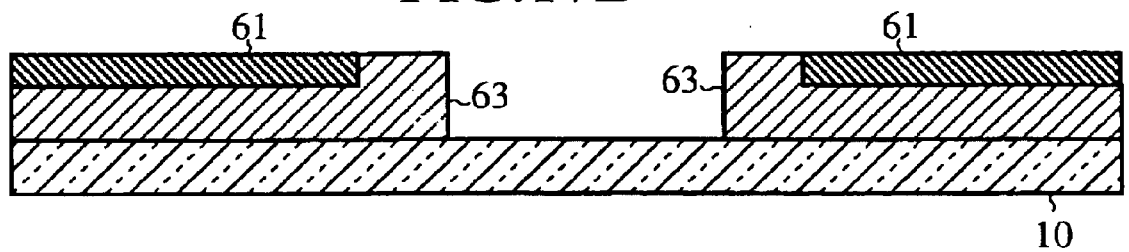
Figure 17C:
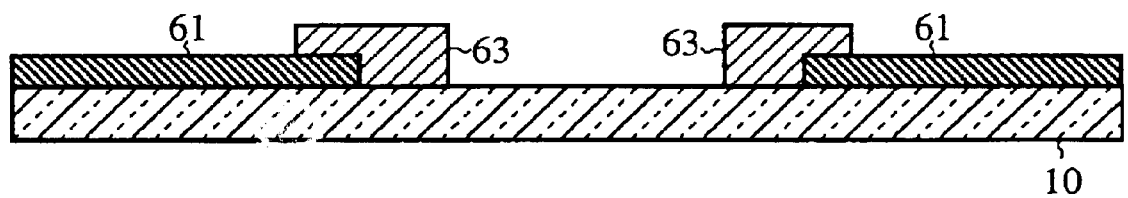
Figure 17D:
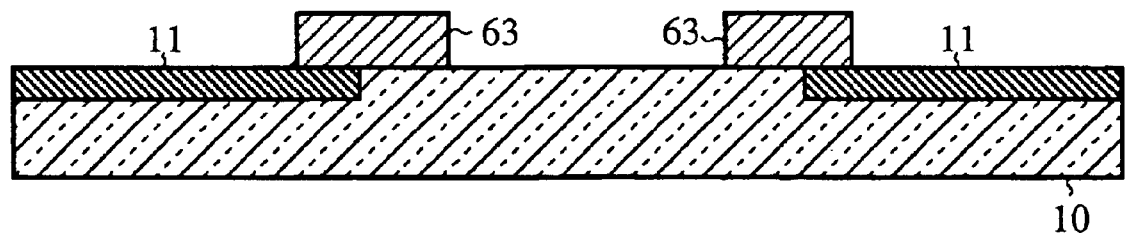
Figure 17E:
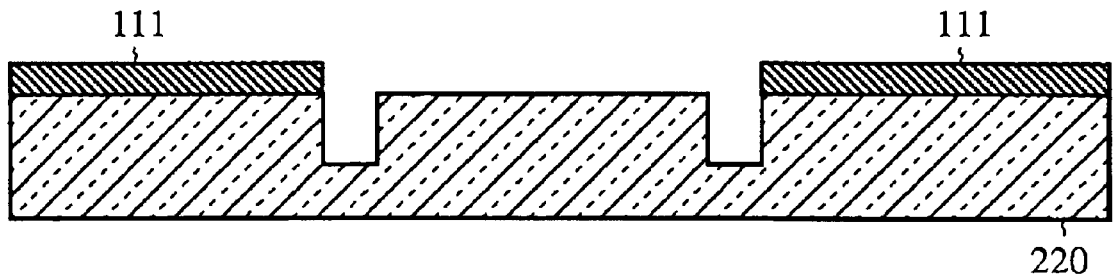
Figure 17F:
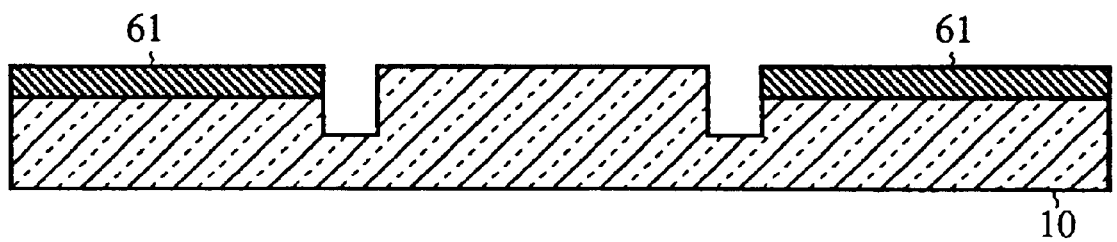
Figure 17G:
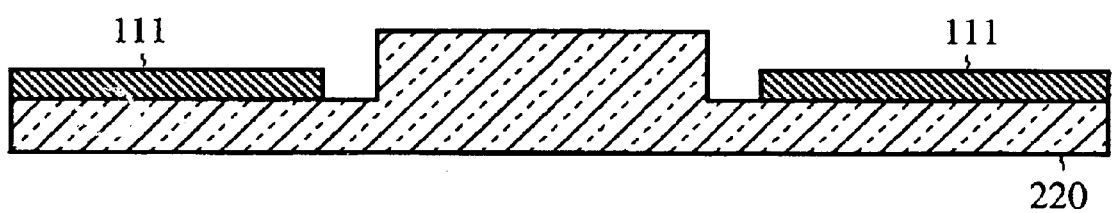
Figure 17H:
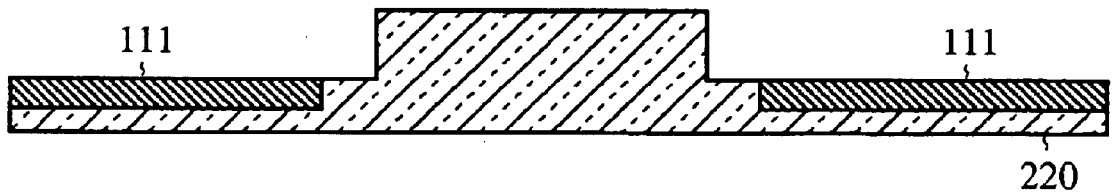
Figure 18A:
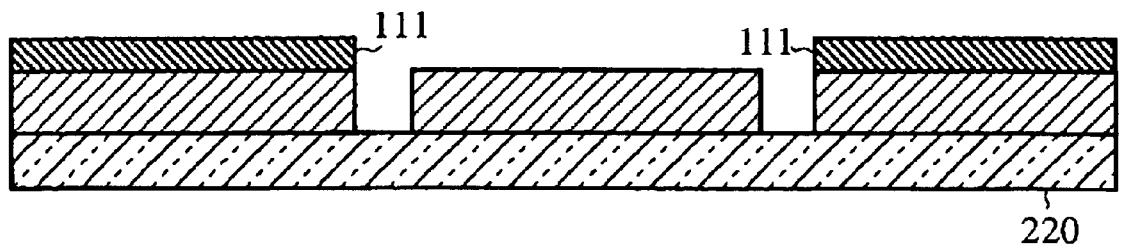
FIG. 18A to FIG. 18H are diagrams showing photomasks, each having the phase shift pattern of the edge highlighting type according to the thirteenth embodiment of the present invention.
Figure 18B:
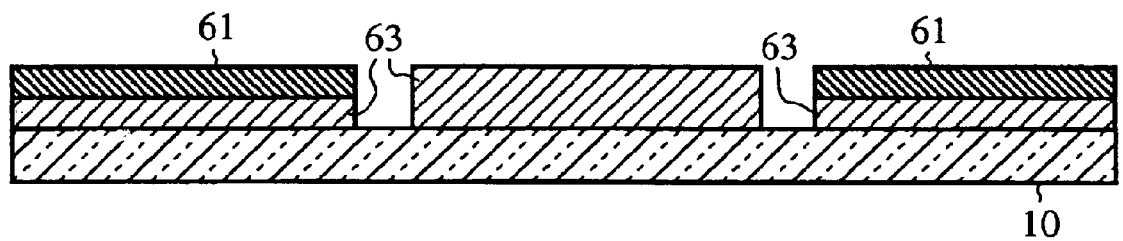
Figure 18C:
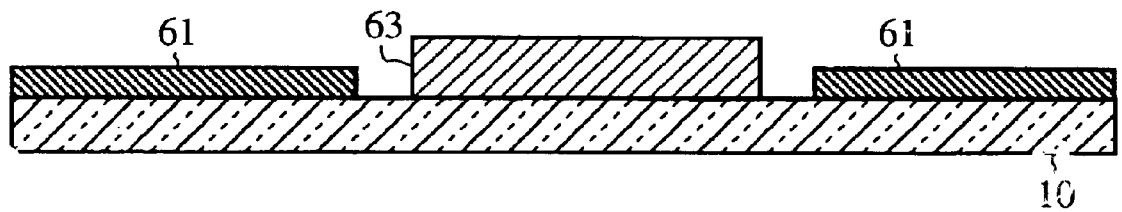
Figure 18D:
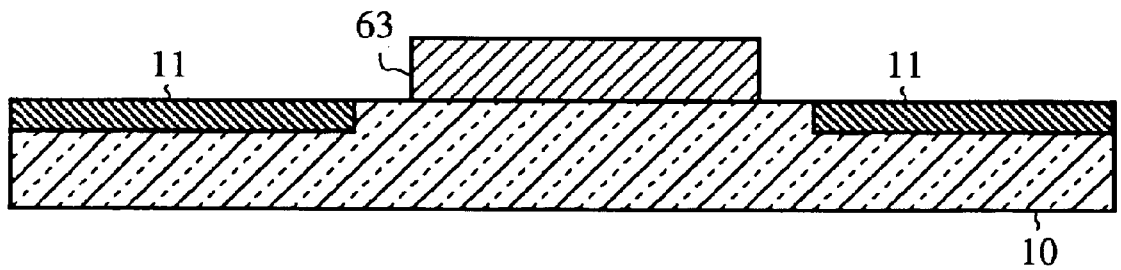
Figure 18E:
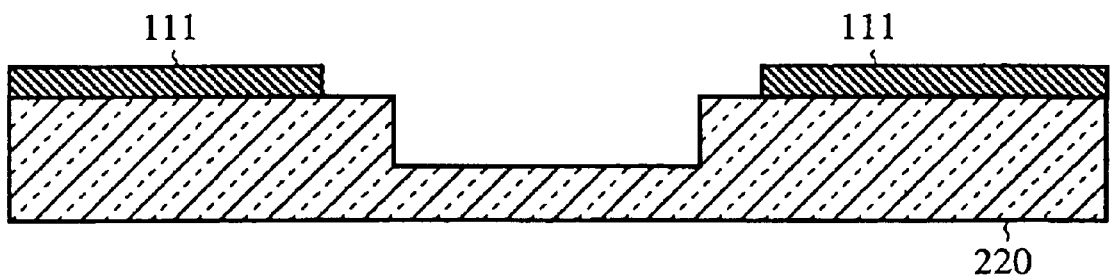
Figure 18F:
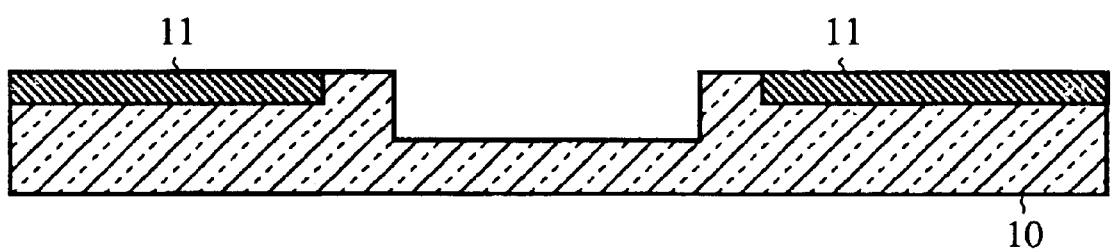
Figure 18G:
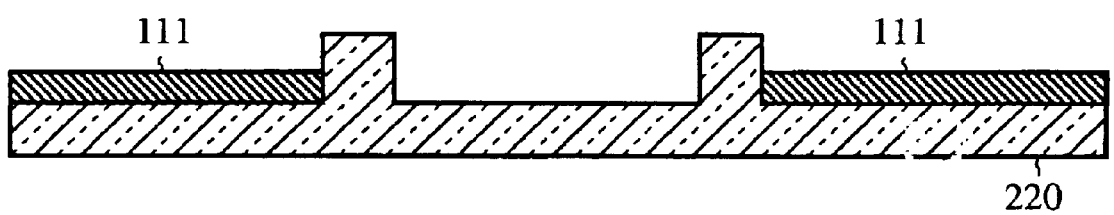
Figure 18H:
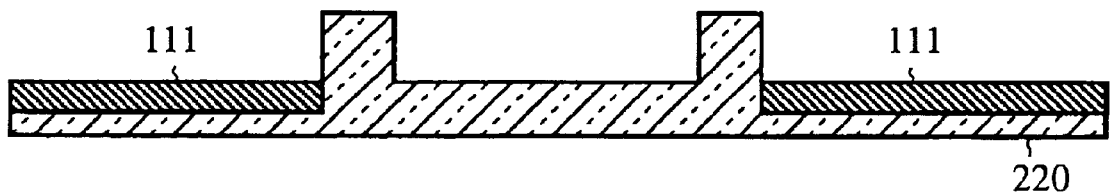

As described above, according to the eleventh embodiment, because the topography of the surface of the photomask is flat and the difference of the step at the shifter section is smaller in height, the effect of a wave guide is relaxed, and the difference between the shifter section and the transparent section is decreased. For example, when semiconductor integrated circuits are manufactured by using the photomasks of the eleventh embodiment, it is possible to increase the performance of the image formation. In addition, it is possible to form the photomask having a high durability to the mechanical stress caused by the brush 41 (see FIG. 7A) during the washing process because the topography of the surface of the photomask is flat when comparing with the conventional photomask, as shown in FIG. 14A, FIG. 14E, and FIG. 14G.

Twelfth Embodiment

FIG. 15A to FIG. 15H and FIG. 16A to FIG. 16H are diagrams showing photomasks, each has a phase shift pattern of an auxiliary shifter type. In particular, FIG. 15B to FIG. 15D, FIG. 15F, FIG. 16B to FIG. 16D, and FIG. 16F show the photomasks having the shift pattern of auxiliary shifter type that can be formed only by the fabrication methods of the second to tenth embodiments according to the present invention. The photomasks having the phase shift pattern of an auxiliary shifter type shown in FIG. 15A, FIG. 15E, FIG. 15G, FIG. 15H, FIG. 16A, FIG. 16E, FIG. 16G, and FIG. 16H are formed by using the conventional photomask fabrication methods. Other components are the same as those of the first to tenth embodiments, therefore the explanation of them is omitted here.

Next, a description will be given of the operation of the photomasks having the phase shift pattern of the auxiliary shifter type as the twelfth embodiment.

When comparing with the conventional photomasks having the phase shift pattern of the auxiliary shifter type, each of the photomasks having the phase shift pattern of the auxiliary shifter type shown in FIG. 15B to FIG. 15D, FIG. 15F, FIG. 16B to FIG. 16D, and FIG. 16F has a unique thickness of the phase shifter and the surface of each photomask is flat. Thereby, the topography of the surface of each photomask is more flat when comparing with that of each photomask shown in FIG. 15A, FIG. 15E, FIG. 15G, FIG. 15H, FIG. 16A, FIG. 16E, FIG. 16G, and FIG. 16H. Thereby, the function of the phase control can be increased and the contrast of the optical image can also be increased. In addition to this features, no mechanical stress happens by the brush 41 (see FIG. 7A) during the washing process. This means each of the photomasks of the twelfth embodiment has a high durability.

As described above, according to the twelfth embodiment, because the topography of the surface of each photomask is flat, the phase control can be easily performed, so that the contrast of an optical image can be increased. That is, as shown in FIG. 15B to FIG. 15D, FIG. 15F, FIG. 16B to FIG. 16D, and FIG. 16F, because the difference of the step at the shifter section is smaller in height, the effect of a wave guide is reduced, and the difference between the shifter section and the transparent section is decreased. For example, when semiconductor integrated circuits are manufactured by using the photomasks of the twelfth embodiment, it is possible to increase the performance of the image formation. In addition, it is possible to form the photomask having a high durability to the mechanical stress caused by the brush 41 (see FIG. 7A) during the washing process because the topography of the surface of each photomask is flat when comparing with each conventional photomask, as shown in FIG. 15A, FIG. 15E, FIG. 15G, FIG. 15H, FIG. 16A, FIG. 16E, FIG. 16G, and FIG. 16H.

Thirteenth Embodiment

FIG. 17A to FIG. 17H and FIG. 18A to FIG. 18H are diagrams showing photomasks, each has a phase shift pattern of an edge highlighting type. In particular, FIG. 17B to FIG. 17D, FIG. 17F, FIG. 18B to FIG. 18D, and FIG. 18F show the photomasks having the shift pattern of the edge highlighting type that can be formed only by the fabrication methods of the second to tenth embodiments according to the present invention. The photomasks having the phase shift pattern of the edge highlighting type shown in FIG. 17A, FIG. 17E, FIG. 17G, FIG. 18H, FIG. 18A, FIG. 18E, FIG. 18G, and FIG. 18H are formed by using the conventional photomask fabrication methods. Other components are the same as those of the first to tenth embodiments, therefore the explanation of them is omitted here.

Next, a description will be given of the operation of the photomasks having the phase shift pattern of the edge highlighting type as the thirteenth embodiment.

When comparing with the conventional photomasks having the phase shift pattern of the edge highlighting type, each of the photomasks having the phase shift pattern of the edge highlighting type shown in FIG. 17B to FIG. 17D, FIG. 17F, FIG. 18B to FIG. 18D, and FIG. 18F has a unique thickness of the phase shifter and the surface of each photomask is flat. Thereby, the topography of the surface of each photomask is more flat when comparing with that of each photomask shown in FIG. 17A, FIG. 17E, FIG. 17G, FIG. 18H, FIG. 18A, FIG. 18E, FIG. 18G, and FIG. 18H. Thereby, the function of the phase control can be increased and the contrast of the optical image can also be increased. In addition to this features, no mechanical stress happens by the brush 41 (see FIG. 7A) during the washing process. This means each of the photomasks of the thirteenth embodiment has a high durability.

As described above, according to the thirteenth embodiment, because the topography of the surface of each photomask is flat, the phase control can be easily performed, so that the contrast of an optical image can be increased. That is, as shown in FIG. 17B to FIG. 17D, FIG. 17F, FIG. 18B to FIG. 18D, and FIG. 186F, because the difference of the step at the shifter section is smaller in height, the effect of a wave guide is reduced, and the difference between the shifter section and the transparent section is decreased. For example, when semiconductor integrated circuits are manufactured by using the photomasks of the thirteenth embodiment, it is possible to increase the performance of the image formation. In addition, it is possible to form the photomask having a high durability to the mechanical stress caused by the brush 41 (see FIG. 7A) during the washing process because the topography of the surface of each photomask is flat when comparing with each photomask shown in FIG. 17A, FIG. 17E, FIG. 17G, FIG. 17H, FIG. 18A, FIG. 18E, FIG. 18G, and FIG. 18H.

Fourteenth Embodiment

Figure 19A:
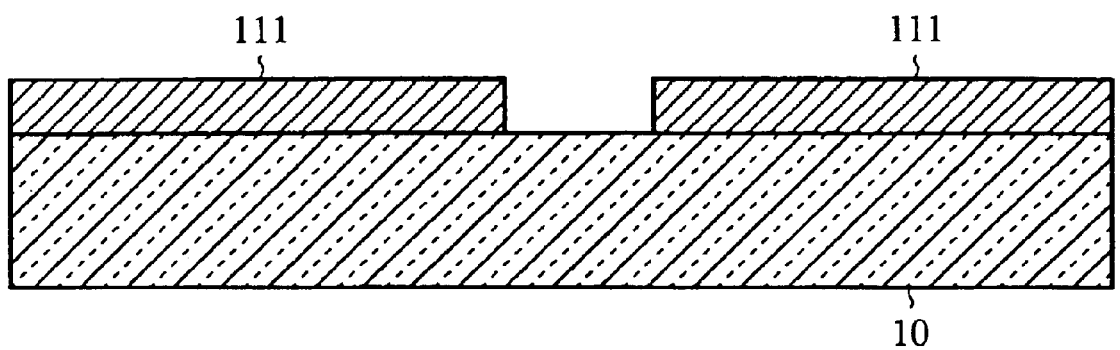
FIG. 19A and FIG. 19B are diagrams showing photomasks, each having a phase shift pattern of a half tone type according to the fourteenth embodiment of the present invention.
Figure 19B:
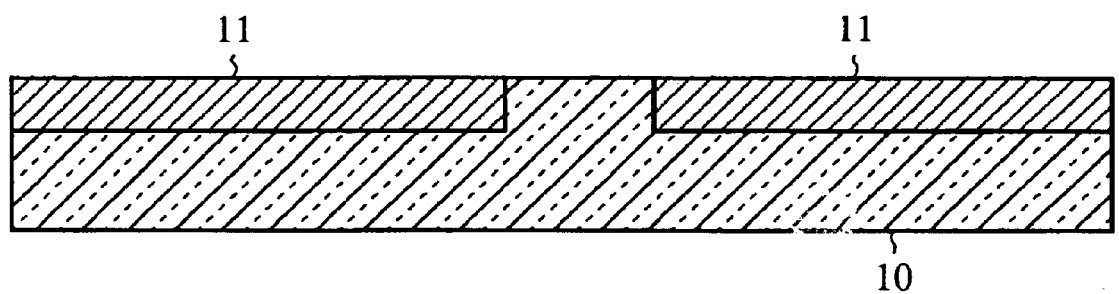

FIG. 19A and FIG. 19B are diagrams showing photomasks, each has a phase shift pattern of a half tone type. In particular, FIG. 19B shows the photomask having the shift pattern of the half tone type that can be formed only by the fabrication method of the second embodiment according to the present invention. The photomask having the phase shift pattern of the half tone type shown in FIG. 19A is formed by using the conventional photomask fabrication method. Other components are the same as those of the first to tenth embodiments, therefore the explanation of them is omitted here.

Next, a description will be given of the operation of the photomask having the shift pattern of the half tone type as the fourteenth embodiment.

When comparing with the conventional photomask having the phase shift pattern of the half tone type, the photomask having the phase shift pattern of the half tone type shown in FIG. 19B has the configuration in which the surface of the photomask is flat. Thereby, the topography of the surface of each photomask is more flat when comparing with that of the photomask shown in FIG. 19A. Thereby, no mechanical stress happens by the brush 41 (see FIG. 7A) during the washing process. This means each of the photomasks of the fourteenth embodiment has a high durability. The semiconductor material such as MoSiON, or CrON is used for forming the half tone section in the photomask.

As described above, according to the fourteenth embodiment, because the topography of the surface of the photomask is flat, it is possible to form the photomask having a high durability to the mechanical stress caused by the brush 41 (see FIG. 7A) during the washing process when comparing with the photomask having the configuration shown in FIG. 19A.

Fifteenth Embodiment

Figure 20A:
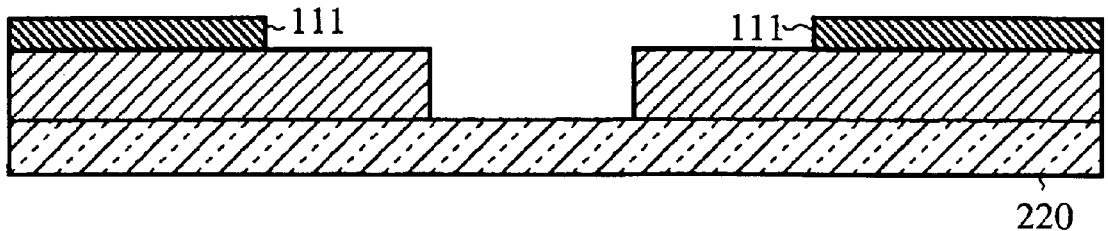
FIG. 20A to FIG. 20H are diagrams showing photomasks, each having a phase shift pattern of a half tone type with shade patterns according to the fifteenth embodiment of the present invention.
Figure 20B:
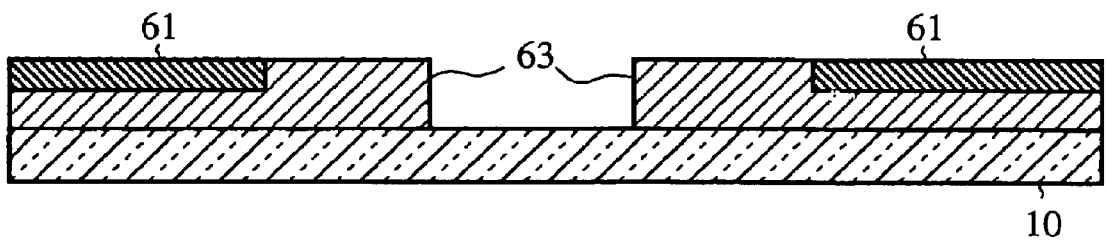
Figure 20C:
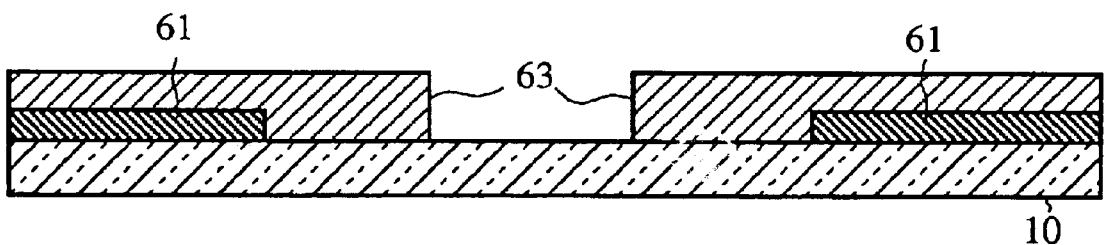
Figure 20D:
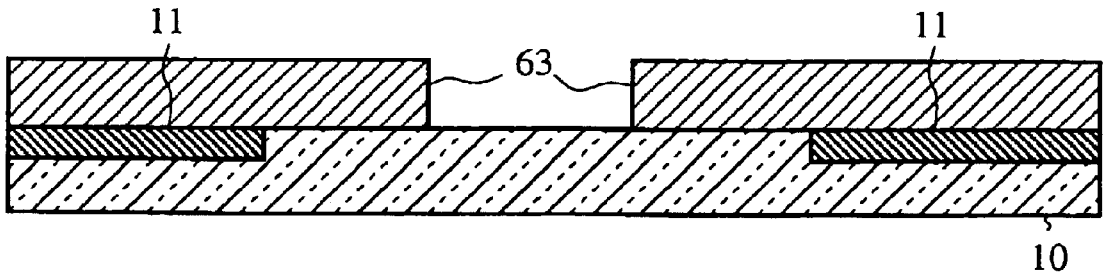
Figure 20E:
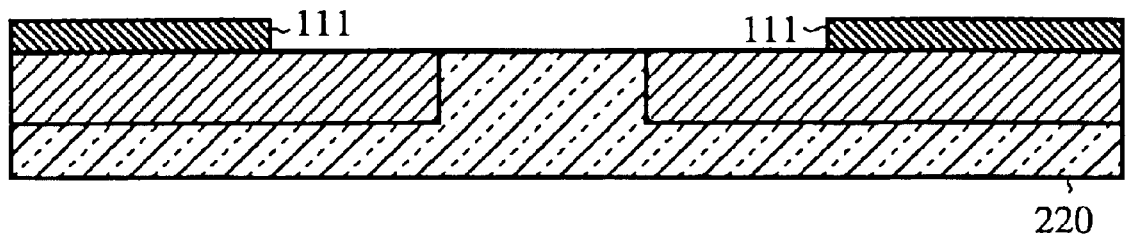
Figure 20F:
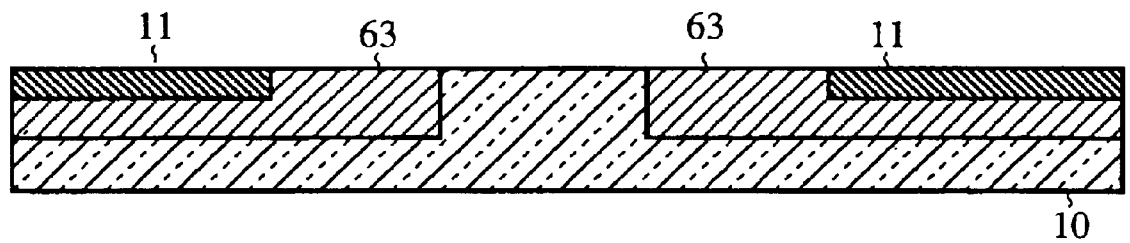
Figure 20G:
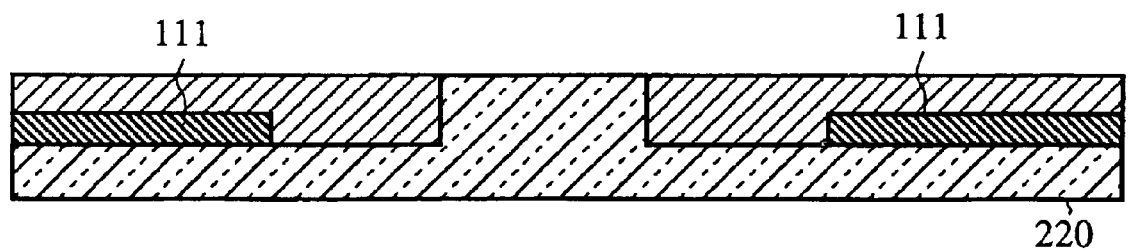
Figure 20H:
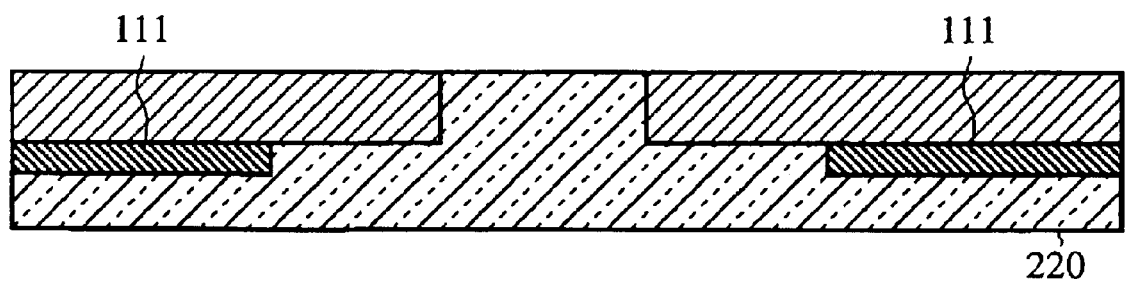
Figure 21A:
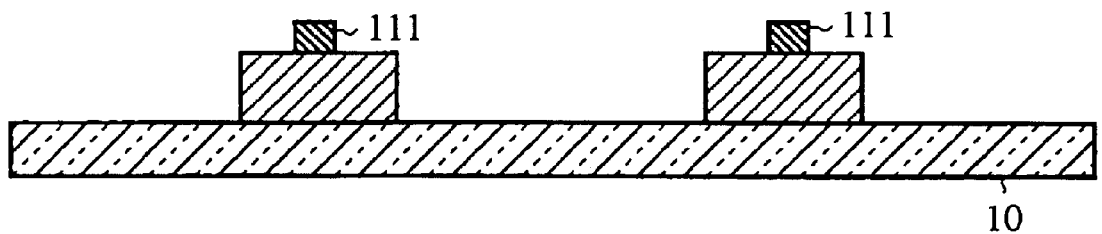
FIG. 21A to FIG. 21H are diagrams showing photomasks, each having a phase shift pattern of a shifter shading type with shade patterns according to the sixteenth embodiment of the present invention.
Figure 21B:
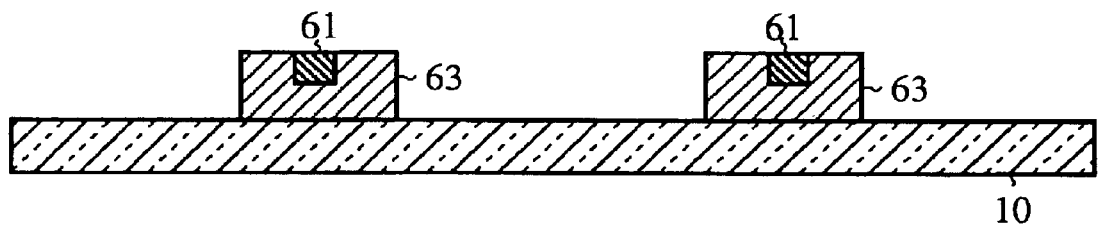
Figure 21C:
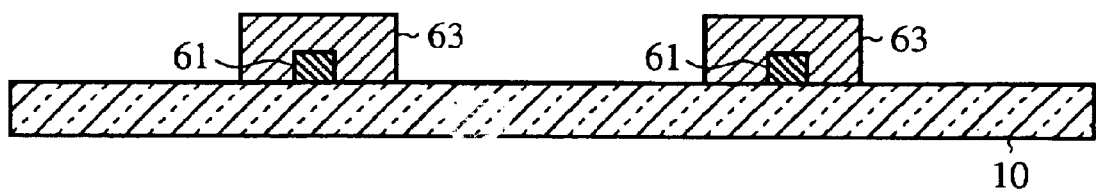
Figure 21D:
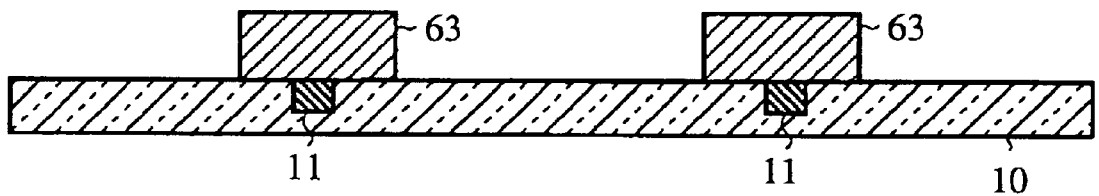
Figure 21E:
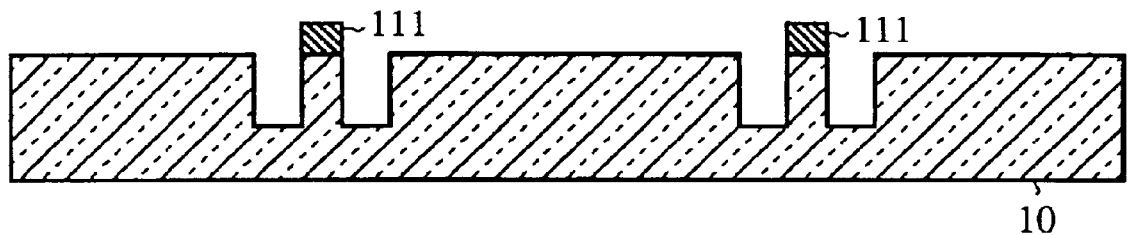
Figure 21F:
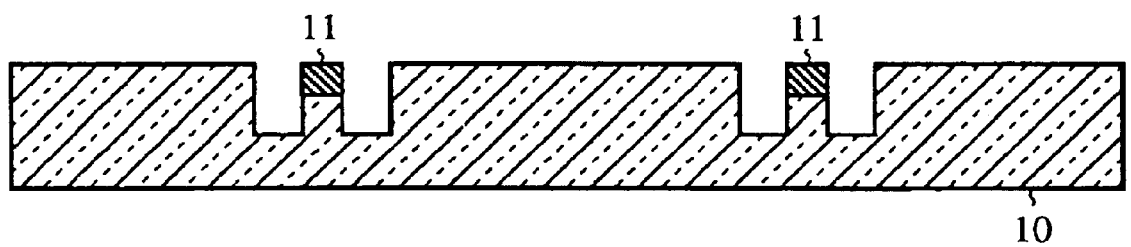
Figure 21G:
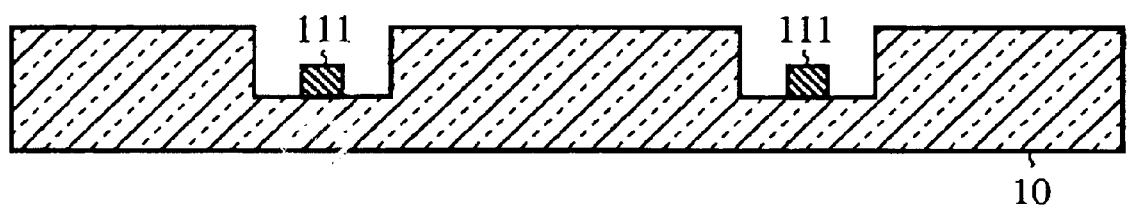
Figure 21H:
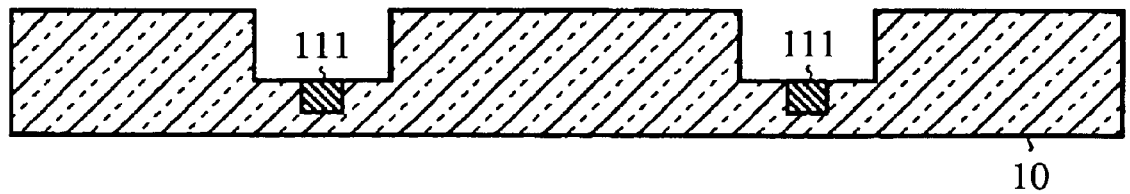
Figure 22A:
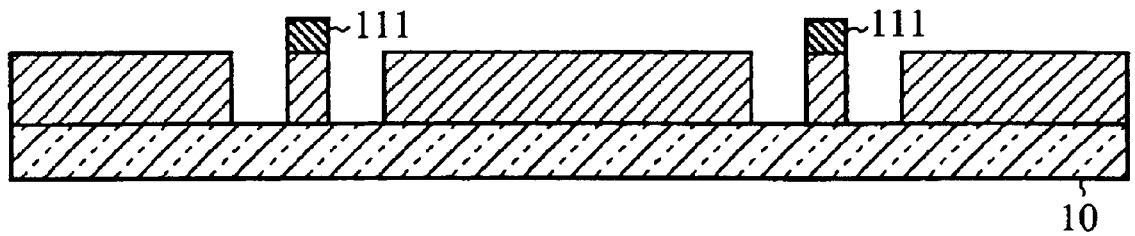
FIG. 22A to FIG. 22H are diagrams showing the photomasks, each having the phase shift pattern of the shifter shading type with shade patterns according to the sixteenth embodiment of the present invention.
Figure 22B:
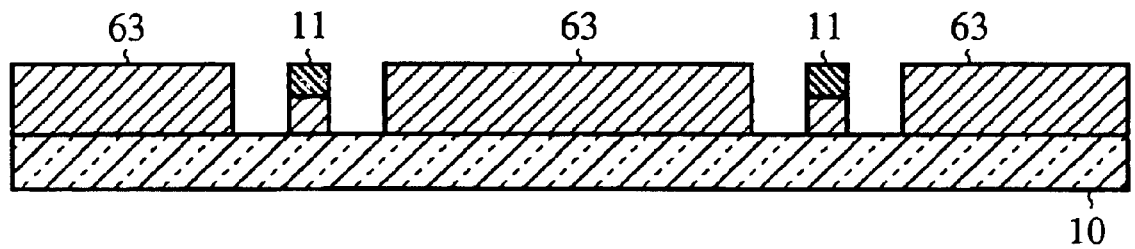
Figure 22C:
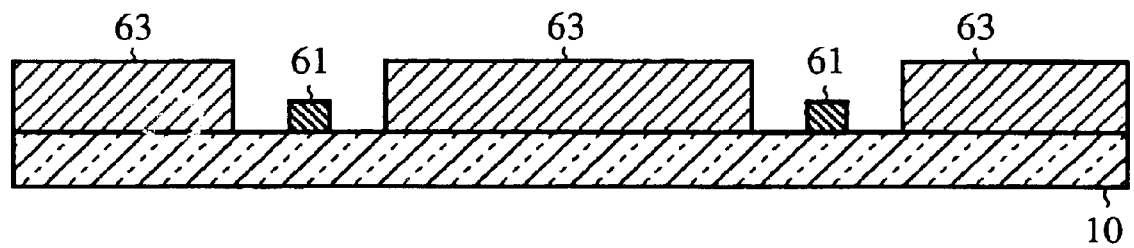
Figure 22D:
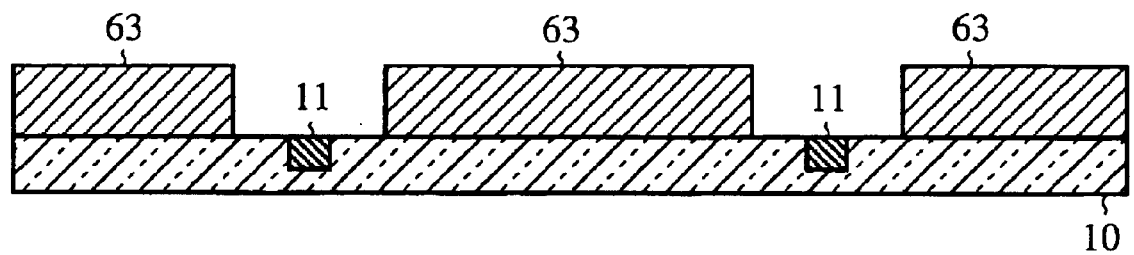
Figure 22E:
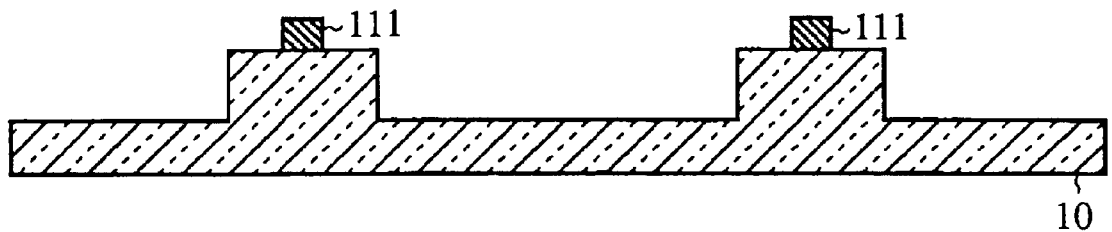
Figure 22F:
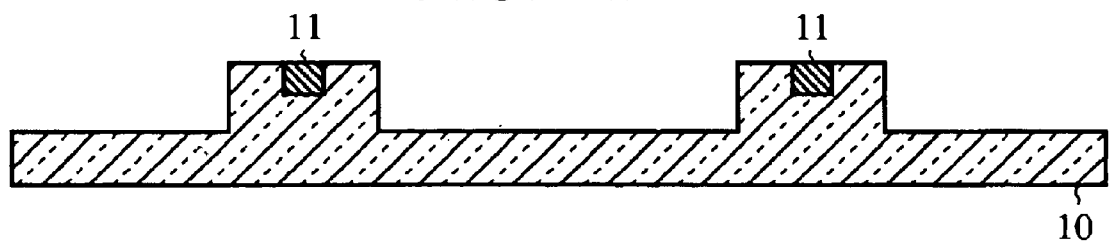
Figure 22G:
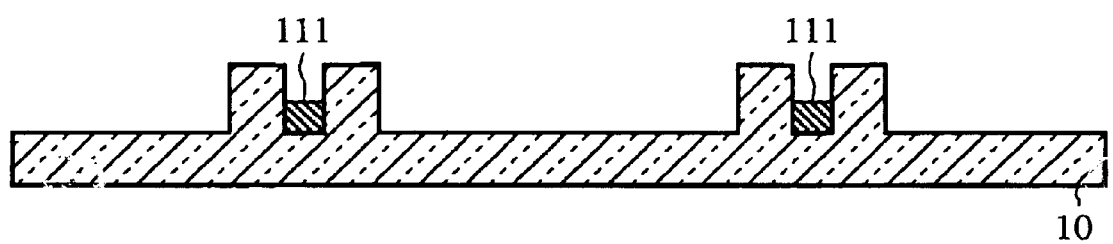
Figure 22H:
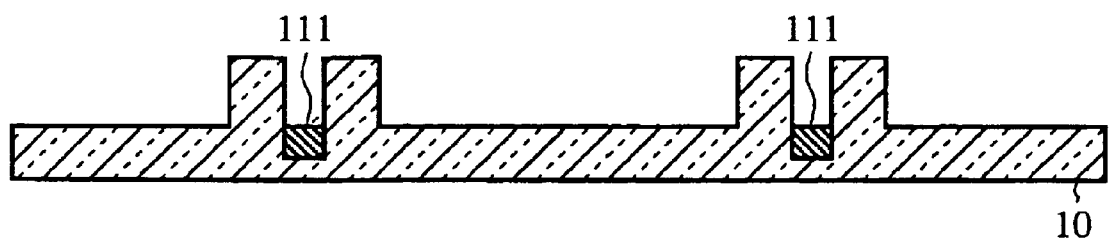
Figure 23A:
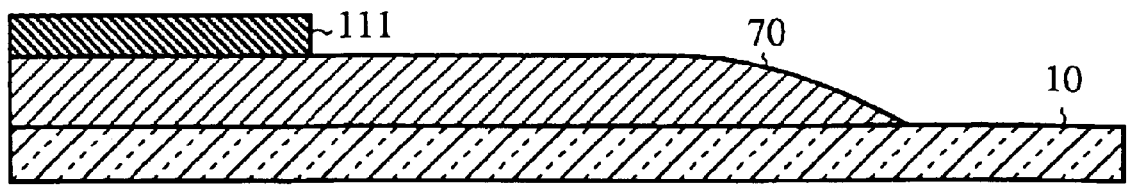
FIG. 23A to FIG. 23H are diagrams showing photomasks, each having a phase shift pattern of an intermediate phase type according to the seventeenth embodiment of the present invention.
Figure 23B:
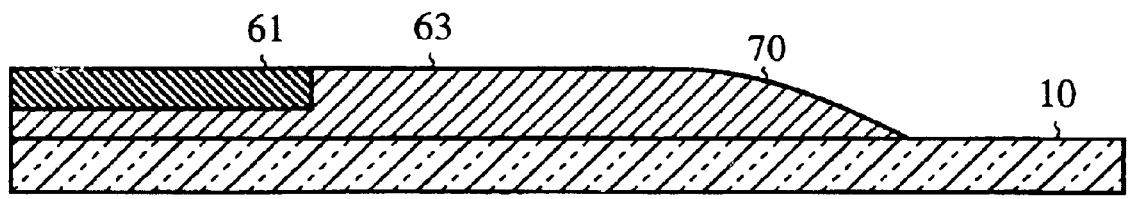
Figure 23C:
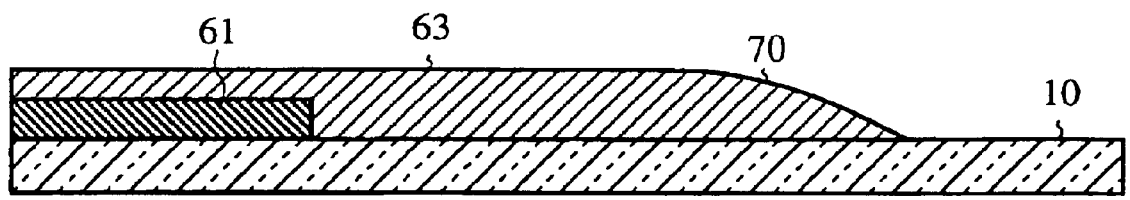
Figure 23D:
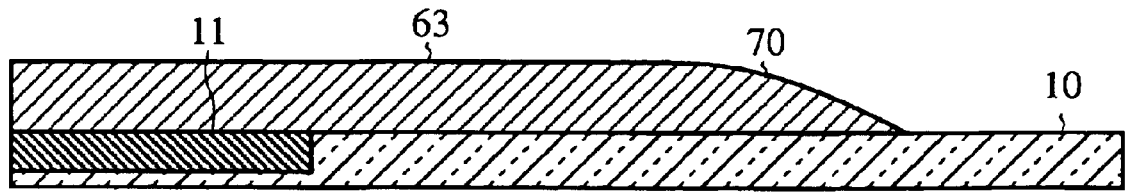
Figure 23E:
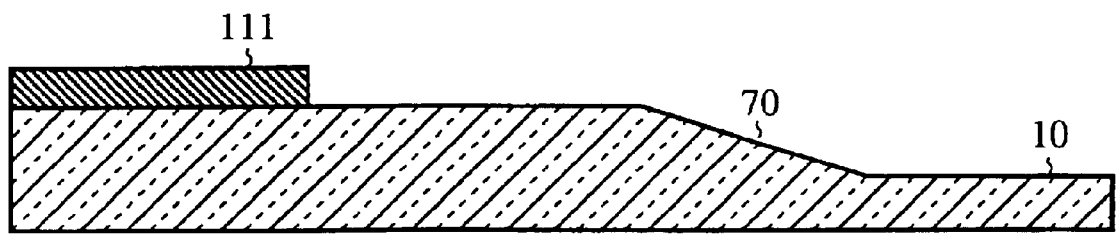
Figure 23F:
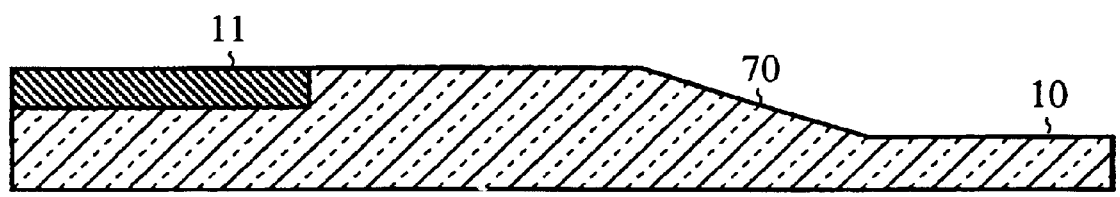
Figure 23G:
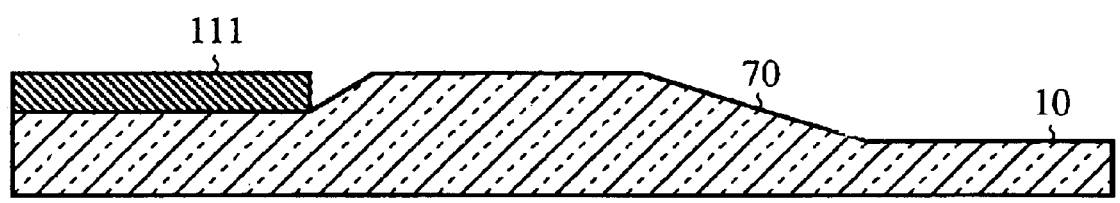
Figure 23H:
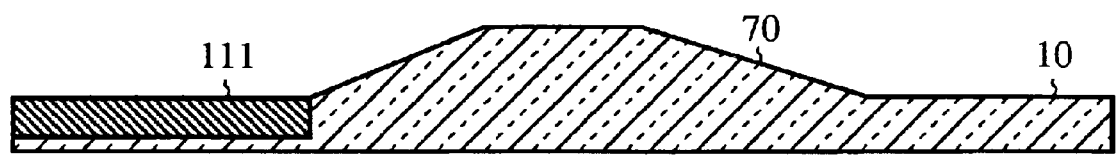

FIG. 20 to FIG. 20H are diagrams showing photomasks having a phase shift pattern of the half tone type with shade patterns according to the fifteenth embodiment of the present invention. In particular, FIG. 20B to FIG. 20D, and FIG. 20F show the photomasks having the shift pattern of the half tone type with the shade pattern that can be formed only by the fabrication methods of the second to tenth embodiments according to the present invention. The photomasks having the phase shift pattern of the half tone type with the shade pattern shown in FIG. 20A, FIG. 20E, FIG. 20G, and FIG. 20H are formed by using the conventional photomask fabrication methods. Other components are the same as those of the first to tenth embodiments, therefore the explanation of them is omitted here.

Next, a description will be given of the operation of the photomask having the phase shift pattern of the half tone type with the shade pattern as the fifteenth embodiment.

When comparing with the conventional photomasks having the phase shift pattern of the half tone type with the shade pattern, in each of the photomasks having the phase shift pattern of the half tone type with the shade pattern shown in FIG. 20B to FIG. 20D, and FIG. 20F, the surface of each photomask is flat. Thereby, the topography of the surface of each photomask is more flat when comparing with that of each photomask shown in FIG. 20A, FIG. 20E, FIG. 20G, and FIG. 20H. Thereby, no mechanical stress happens by the brush 41 (see FIG. 7A) during the washing process. This means each of the photomasks of the fifteenth embodiment has a high durability.

As described above, according to the fifteenth embodiment, because the topography of the surface of each photomask is flat, it is possible to form the photomask having a high durability to the mechanical stress caused by the brush 41 (see FIG. 7A) during the washing process.

Sixteenth Embodiment

FIG. 21A to FIG. 21H and FIG. 22A to FIG. 22H are diagrams showing a photomask, each having a phase shift pattern of a shifter shading type with shade patterns. In particular, FIG. 21B to FIG. 21D, FIG. 21F, FIG. 22B to FIG. 22D, and FIG. 22F show the photomasks having the shift pattern of the shifter shading type with the shade pattern that can be formed only by the fabrication methods of the second to tenth embodiments according to the present invention. The photomasks having the phase shift pattern of the shifter shading type with the shade pattern shown in FIG. 21A, FIG. 21E, FIG. 21G, FIG. 21H, FIG. 22A, FIG. 22E, FIG. 22G, and FIG. 22H are formed by using the conventional photomask fabrication methods. Other components are the same as those of the first to tenth embodiments, therefore the explanation of them is omitted here.

Next, a description will be given of the operation of the photomasks having the phase shift pattern of the shifter shading type with the shade pattern as the sixteenth embodiment.

When comparing with the conventional photomasks having the phase shift pattern of the shifter shading type with the shade pattern, in each of the photomasks having the phase shift pattern of the edge highlighting type shown in FIG. 21B to FIG. 21D, FIG. 21F, FIG. 22B to FIG. 22D, and FIG. 22F, the surface of each photomask is flat and each shifter in the photomask has an unique thickness. Thereby, the topography of the surface of each photomask is more flat when comparing with that of each photomask shown in FIG. 21A, FIG. 21E, FIG. 21G, FIG. 21H, FIG. 22A, FIG. 22E, FIG. 22G, and FIG. 22H. Thereby, the function of the phase control can be increased and the contrast of the optical image can also be increased. In addition to this features, no mechanical stress happens by the brush 41 (see FIG. 7A) during the washing process. This means each of the photomasks of the sixteenth embodiment has a high durability.

As described above, according to the sixteenth embodiment, because the topography of the surface of each photomask is flat, the phase control can be easily performed, so that the contrast of an optical image can be increased. That is, as shown in FIG. 21B to FIG. 21D, FIG. 21F, FIG. 22B to FIG. 22D, and FIG. 22F, because the difference of the step at the shifter section is smaller in height, the effect of a wave guide is reduced, and the difference between the shifter section and the transparent section is decreased. For example, when semiconductor integrated circuits are manufactured by using the photomasks of the sixteenth embodiment, it is possible to increase the performance of the image formation. In addition, it is possible to form the photomask having a high durability to the mechanical stress caused by the brush 41 (see FIG. 7A) during the washing process because the topography of the surface of each photomask is more flat when comparing with each photomask shown in FIG. 21A, FIG. 21E, FIG. 21G, FIG. 21H, FIG. 22A, FIG. 22E, FIG. 22G, and FIG. 22H.

Seventeenth Embodiment

FIG. 23A to FIG. 23H are diagrams showing photomasks, each has a phase shift pattern of an intermediate phase type. In particular, FIG. 23B to FIG. 23D, FIG. 23F show the photomasks, each has the shift pattern of the intermediate phase type that can be formed only by the fabrication methods of the second to tenth embodiments according to the present invention. Sections other than the boundary section 70 in the photomasks having the phase shift pattern of the intermediate phase type shown in FIG. 23A, FIG. 23E, FIG. 23G, and FIG. 23H are formed by using the conventional photomask fabrication methods. Other components are the same as those of the first to tenth embodiments, therefore the explanation of them is omitted here.

Next, a description will be given of the operation of the photomasks having the phase shift pattern of the intermediate phase type as the seventeenth embodiment.

When comparing with the photomasks having the phase shift pattern of the intermediate phase type shown in FIG. 23A, FIG. 23E, FIG. 23G, and FIG. 23H, the surface of each of the photomasks having the phase shift pattern of the edge highlighting type shown in FIG. 23B to FIG. 23D, and FIG. 23F is flat, and the shifter adjacent to the shade pattern in each of the photomasks has an unique thickness. Thereby, the function of the phase control can be increased and the contrast of the optical image can also be increased. In addition to this features, no mechanical stress happens by the brush 41 (see FIG. 7A) during the washing process. This means each of the photomasks of the seventeenth embodiment has a high durability.

As described above, according to the seventeenth embodiment, because the topography of the surface of each photomask is flat, the phase control can be easily performed, so that the contrast of an optical image can be increased. That is, as shown in FIG. 23B to FIG. 23D, and FIG. 23F, because the difference of the step at the shifter section is smaller in height, the effect of a wave guide is relaxed, and the difference between the shifter section and the transparent section is decreased. For example, when semiconductor integrated circuits are manufactured by using the photomasks of the seventeenth embodiment, it is possible to increase the performance of the image formation. In addition, it is possible to form the photomask having a high durability to the mechanical stress caused by the brush 41 (see FIG. 7A) during the washing process because the topography of the surface of each photomask is more flat when comparing with each of the photomasks shown in FIG. 23A, FIG. 23E, FIG. 23G, and FIG. 23H.

Eighteenth Embodiment

Figure 24:
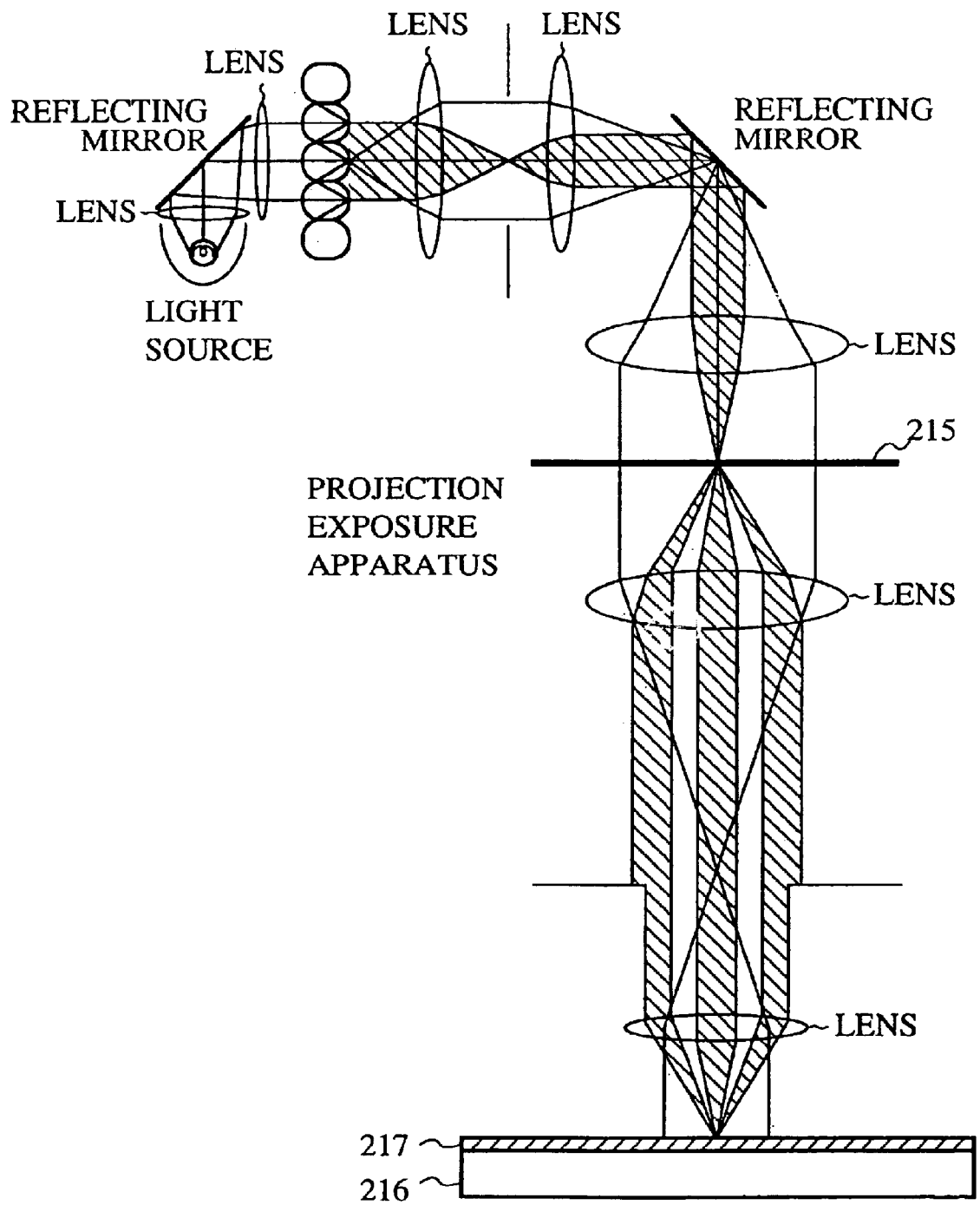
FIG. 24 is a diagram showing a projection exposure apparatus to be used for the fabrication methods of semiconductor integrated circuits by using the photomasks of the present invention.

FIG. 24 is a diagram showing a projection exposure apparatus (or a step and repeat exposure apparatus) to be used for fabricating semiconductor integrated circuits such as a liquid crystal display device by using the photomasks of the present invention. In FIG. 24, the reference number 215 designates one of the photomasks of the present invention, 216 designates a wafer to be used during the semiconductor manufacturing process for manufacturing semiconductor integrated circuits, and 217 denotes a resist film coated on the wafer 216. The projection exposure apparatus shown in FIG. 24 is used for the manufacturing process of the semiconductor integrated circuits.

Next, a description will be given of the operation of the projection exposure apparatus shown in FIG. 24.

When semiconductor integrated circuits such as liquid crystal display devices are manufactured by using the photomask 215 of the present invention, the photomask 215 is placed in the projection exposure apparatus shown in FIG. 24. Then, the resist film 217 is coated on the wafer 216.

Next, a light source generates and radiates a radiation ray such as a monochromatic ray, an electron beam, a laser beam, or a X ray on the photomask 215 through lenses. Thereby, the pattern of the photomask 215 is printed on the resist 217 coated on the wafer 216. After this exposure process of the wafer 216, the developing process, the etching process, and the elimination process of the photo resist are performed in order. It is possible to repeat these processes if required. Finally, the desired semiconductor integrated circuits are fabricated.

As described above, according to the eighteenth embodiment, the photomask 215 having a high quality that is free from defects of the shade pattern, as one of the photomasks obtained by the first to seventeenth embodiments, is placed in the projection exposure apparatus shown in FIG. 24 and then exposed under the radiation ray such as a monochromatic ray, an electron beam, a laser beam, or a X ray generated by the light source in order to fabricate the semiconductor integrated circuit such as the liquid crystal display and other devices. Therefore it is possible to increase the phase control of the photomask and also to increase the contrast of the optical image on the resist film 217 on the wafer 216. This features causes to increase the yield of the semiconductor integrated circuits with a high quality.

As described above in detail, according to the present invention, each of the photomasks of the present invention has the configuration in which the shade pattern is formed in the hollow section in the transparent substrate such as the transparent glass substrate, and the surface of the shade pattern and the surface of the transparent glass substrate are formed on a same plane. Therefore the topography of the photomask is flat. That is, a complicated surface is formed on the photomask, not like the conventional photomask. This configuration of the photomask of the present invention has a high durability to the mechanical stress caused in the chemical and mechanical polishing during the washing process. This causes to fabricate the photomask with a high quality that is free from the defect of the shade pattern. To use the photomask of the present invention for manufacturing semiconductor integrated circuits such as liquid crystal displays and so on can increases the yield of the semiconductor integrated circuits.

In addition, in the photomasks according to the present invention, many kinds of the phase shift patterns in the photomasks in which the phase shift pattern has a unique thickness and the surface of the phase shift pattern is flat are formed. It is therefore possible to fabricate the photomask in which no shade section is formed in the boundary section between the phase shift pattern and the transparent glass section and no phase defect is formed at the boundary section. In addition, the difference of the step at the shifter section is smaller in height, the effect of a wave guide is reduced, and the difference between the shifter section and the transparent section is decreased. For example, when semiconductor integrated circuits are manufactured by using the photomasks of the present invention, it is possible to increase the performance of the image formation. In addition, it is possible to form the photomask having a high durability to the mechanical stress caused by the brush during the washing process because the topography of the surface of the photomask is flat when comparing with the conventional one. Therefore it is possible to increase the yield of semiconductor integrated circuits manufactured by using the photomask of the present invention because the function of the phase control can be increased and the contrast of the optical image can also be increased.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A photomask at least comprising:
   a transparent substrate;
   a hollow section formed on a main surface of said transparent substrate;
   a shade pattern formed in said hollow section; and
   a reflection preventing film formed on a back or surface of said shade pattern, wherein the surface of said shade pattern is planarized by a chemical and mechanical polishing thereon.

2. A photomask comprising:
   a transparent substrate;
   a shade pattern formed selectively on a main surface of said transparent substrate; and
   a phase shift pattern selectively formed on said shade pattern and said transparent substrate,
   wherein said phase shift pattern has a surface planarized to a degree obtained by a chemical and mechanical polishing, wherein said phase shift pattern includes a phase shift pattern formed every other opening on the photomask.

3. A photomask comprising:
   a transparent substrate;

a shade pattern formed selectively on a main surface of said transparent substrate; and a phase shift pattern selectively formed on said shade pattern and said transparent substrate, wherein said phase shift pattern has a surface planarized to a degree obtained by a chemical and mechanical polishing, wherein said phase shift pattern includes a phase shift pattern having an auxiliary opening with a shifter which is not resolved adjacent to a main opening.

4. A photomask comprising:

a transparent substrate;

a shade pattern formed selectively on a main surface of said transparent substrate; and a phase shift pattern selectively formed on said shade pattern and said transparent substrate, wherein said phase shift pattern has a surface planarized to a degree obtained by a chemical and mechanical polishing, wherein said phase shift pattern includes a phase shift pattern formed at an edge of a main opening.

5. A photomask comprising:

a transparent substrate;

a shade pattern formed selectively on a main surface of said transparent substrate; and a phase shift pattern selectively formed on said shade pattern and said transparent substrate, wherein said phase shift pattern has a surface planarized to a degree obtained by a chemical and mechanical polishing, further including a halftone phase shift pattern with a shade pattern.

6. A photomask comprising:

a transparent substrate;

a shade pattern formed selectively on a main surface of said transparent substrate; and a phase shift pattern selectively formed on said shade pattern and said transparent substrate, wherein said phase shift pattern has a surface planarized to a degree obtained by a chemical and mechanical polishing, wherein said phase shift pattern has a shade pattern formed with a phase shifter.

7. A photomask comprising:

a transparent substrate;

a shade pattern formed selectively on a main surface of said transparent substrate; and a phase shift pattern selectively formed on said shade pattern and said transparent substrate, wherein said phase shift pattern has a surface planarized to a degree obtained by a chemical and mechanical polishing, further including an intermediate type phase shift pattern.

8. A photomask fabrication method at least comprising the steps of:

forming a resist on a transparent substrate;

forming a pattern by selectively exposing and developing said resist by using a radiation ray;

selectively etching said transparent substrate by using said resist as a mask;

eliminating said resist;

forming a first reflection preventing film on said transparent substrate which is selectively etched;

forming a shade film on said first reflection preventing film;

performing a chemical and mechanical polishing for said shade film; and forming a second reflection preventing film.

9. A photomask fabrication method at least comprising the steps of:

forming a resist on a shade film on a transparent substrate;

forming a pattern by selectively exposing and developing said resist by using a radiation ray;

selectively etching said shade film using said resist as a mask;

eliminating said resist;

forming a phase shift film on said shade film which is selectively etched;

selectively etching said phase shift film; and performing a chemical and mechanical polishing after selectively etching of said phase shift film.

10. A photomask fabrication method according to claim 9, after the step of forming said phase shift pattern, further comprises the step of:

performing a chemical and mechanical polishing.

11. A photomask fabrication method according to claim 9, after the step of eliminating said resist, further comprises the steps of:

forming a second resist film on said shade film which is selectively etched;

selectively etching said second resist film to form a second resist pattern;

selectively etching said transparent substrate by using said second resist pattern as a mask;

eliminating said second resist pattern; and performing said chemical and mechanical polishing.

12. A photomask fabrication method at least comprising the steps of:

forming a resist on a transparent substrate;

forming a pattern by selectively exposing and developing said resist by using a radiation ray;

selectively etching said transparent substrate by using said resist as a mask;

eliminating said resist;

forming a shade film on said transparent substrate which is selectively etched;

performing a chemical and mechanical polishing for said shade film;

forming a phase shift film on said shade film;

selectively etching said phase shift film; and performing a chemical and mechanical polishing.

13. A photomask fabrication method at least comprising the steps of:

forming a resist on a transparent substrate;

forming a pattern by selectively exposing and developing said resist by using a radiation ray;

selectively etching said transparent substrate by using said resist as a mask;

eliminating said resist;

forming a shade film on said transparent substrate which is selectively etched;

performing a chemical and mechanical polishing for said shade film;

forming a resist film on said shade film;

selectively etching said resist film;

selectively etching said transparent substrate; and performing said chemical and mechanical polishing for a phase shift pattern formed by selectively etching said transparent substrate.

14. A photomask fabrication method according to claim 8, wherein one of an electron beam, a laser beam, and a monochromatic beam is used as said radiation ray.

15. A fabrication method of semiconductor integrated circuits such as a liquid crystal display, wherein said photomask according to claim 1 is used.

16. A fabrication method of semiconductor integrated circuits such as a liquid crystal display, wherein said photomask fabrication method according to claim 8 is included.

17. A photomask comprising:
a transparent substrate;
a shade pattern formed selectively on a main surface of said transparent substrate;
a phase shift pattern selectively formed on said shade pattern and said transparent substrate,
wherein said phase shift pattern has a surface planarized to a degree obtained by a chemical and mechanical polishing, wherein an end section of said phase shift pattern that is contacted to said transparent substrate has a sloped shape that gradually decreases, the sloped shape formed by chemical and mechanical polishing and, wherein said phase shift pattern includes a phase shift pattern formed every other opening on the photomask.

18. A photomask comprising:
a transparent substrate;
a shade pattern formed selectively on a main surface of said transparent substrate; and
a phase shift pattern selectively formed on said shade pattern and said transparent substrate,
wherein said phase shift pattern has a surface planarized to a degree obtained by a chemical and mechanical polishing, wherein a difference of a step, between said phase shift pattern and said transparent substrate at said end section of said phase shift pattern that is contacted to said transparent substrate, gradually decreases, the gradual decrease formed by chemical and mechanical polishing and, wherein said phase shift pattern includes a phase shift pattern formed every other opening on the photomask.

19. A method of fabricating a photomask comprising the steps of:
forming a hollow section on a main surface of a transparent substrate;
forming a shade pattern in said hollow section;
selectively forming a phase shift pattern on said transparent substrate and said shade pattern; and
forming, by chemical and mechanical polishing, a slope shape on a surface of said phase shift pattern so that a thickness of a portion of said phase shift pattern in contact with said transparent substrate gradually decreases, wherein said phase shift pattern includes a phase shift pattern formed every other opening on the photomask.

20. A method of fabricating a photomask comprising the steps of:
forming a hollow section on a main surface of a transparent substrate;
forming a shade pattern in said hollow section, said shade pattern having a surface which is not in contact with said transparent substrate and forming a same plane together with the main surface of the transparent substrate; and
selectively etching said main surface of said transparent substrate to form a phase shift pattern after forming said shade pattern, wherein said phase shift pattern includes a phase shift pattern formed every other opening on the photomask.

21. A method of fabricating a photomask comprising the steps of:
forming a hollow section on a main surface of a transparent substrate;
forming a shade pattern in said hollow section, said shade pattern having a surface which is not in contact with said transparent substrate and forming a same plane together with the main surface of the transparent substrate;
selectively etching said main surface of said transparent substrate to form a phase shift pattern after forming said shade pattern;
forming an end section of said phase shift pattern that is in contact with said transparent substrate to have a sloped shape that gradually decreases; and
forming said phase shift pattern to include a phase shift pattern formed every other opening on the photomask.

22. A photomask comprising:
a transparent substrate;
a shade pattern formed selectively on a main surface of said transparent substrate; and
a phase shift pattern selectively formed on said shade pattern and said transparent substrate,
wherein said phase shift pattern has a surface planarized to a degree obtained by a chemical and mechanical polishing, wherein an end section of said phase shift pattern that is contacted to said transparent substrate has a sloped shape that gradually decreases, the sloped shape formed by chemical and mechanical polishing and, wherein said phase shift pattern includes a phase shift pattern having an auxiliary opening with a shifter which is not resolved adjacent to a main opening.

23. A photomask comprising:
a transparent substrate;
a shade pattern formed selectively on a main surface of said transparent substrate; and
a phase shift pattern selectively formed on said shade pattern and said transparent substrate,
wherein said phase shift pattern has a surface planarized to a degree obtained by a chemical and mechanical polishing, wherein a difference of a step, between said phase shift pattern and said transparent substrate at said end section of said phase shift pattern that is contacted to said transparent substrate, gradually decreases, the gradual decrease formed by chemical and mechanical polishing and, wherein said phase shift pattern includes a phase shift pattern having an auxiliary opening with a shifter which is not resolved adjacent to a main opening.

24. A method of fabricating a photomask comprising the steps of:
forming a hollow section on a main surface of a transparent substrate;
forming a shade pattern in said hollow section;
selectively forming a phase shift pattern on said transparent substrate and said shade pattern; and
forming, by chemical and mechanical polishing, a slope shape on a surface of said phase shift pattern so that a thickness of a portion of said phase shift pattern in contact with said transparent substrate gradually decreases, wherein said phase shift pattern includes a phase shift pattern having an auxiliary opening with a shifter which is not resolved adjacent to a main opening.

25. A method of fabricating a photomask comprising the steps of:

forming a hollow section on a main surface of a transparent substrate;

forming a shade pattern in said hollow section, said shade pattern having a surface which is not in contact with said transparent substrate and forming a same plane together with the main surface of the transparent substrate; and selectively etching said main surface of said transparent substrate to form a phase shift pattern after forming said shade pattern, wherein said phase shift pattern includes a phase shift pattern having an auxiliary opening with a shifter which is not resolved adjacent to a main opening.

26. A method of fabricating a photomask comprising the steps of:

forming a hollow section on a main surface of a transparent substrate;

forming a shade pattern in said hollow section, said shade pattern having a surface which is not in contact with said transparent substrate and forming a same plane together with the main surface of the transparent substrate;

selectively etching said main surface of said transparent substrate to form a phase shift pattern after forming said shade pattern;

forming an end section of said phase shift pattern that is in contact with said transparent substrate to have a sloped shape that gradually decreases; and forming wherein said phase shift pattern to include a phase shift pattern having an auxiliary opening with a shifter which is not resolved adjacent to a main opening.

27. A photomask comprising:

a transparent substrate;

a hollow section formed on a main surface of said transparent substrate;

a shade pattern formed in said hollow section;

a phase shift pattern formed by selectively etching said transparent substrate; and a halftone phase shift pattern with a shade pattern.

28. A photomask comprising:

a transparent substrate;

a hollow section formed on a main surface of said transparent substrate;

a shade pattern formed in said hollow section; and a phase shift pattern formed by selectively etching said transparent substrate, and having a shade pattern formed with a phase shifter.

29. A photomask comprising:

a transparent substrate;

a hollow section formed on a main surface of said transparent substrate;

a shade pattern formed in said hollow section;

a phase shift pattern formed by selectively etching said transparent substrate; and an intermediate type phase shift pattern.

30. A photomask fabrication method according to claim 9, wherein one of an electron beam, a laser beam, and a monochromatic beam is used as said radiation ray.

31. A photomask fabrication method according to claim 10, wherein one of an electron beam, a laser beam, and a monochromatic beam is used as said radiation ray.

32. A photomask fabrication method according to claim 11, wherein one of an electron beam, a laser beam, and a monochromatic beam is used as said radiation ray.

33. A photomask fabrication method according to claim 12, wherein one of an electron beam, a laser beam, and a monochromatic beam is used as said radiation ray.

34. A photomask fabrication method according to claim 13, wherein one of an electron beam, a laser beam, and a monochromatic beam is used as said radiation ray.

* * * * *